(12) United States Patent
Cook

(10) Patent No.: US 10,670,633 B2
(45) Date of Patent: *Jun. 2, 2020

(54) ROGOWSKI COIL BASED ALARM SYSTEM

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 297 days.

This patent is subject to a terminal disclaimer.

(21) Appl. No.: 15/179,003

(22) Filed: Jun. 10, 2016

(65) Prior Publication Data

US 2017/0059624 A1 Mar. 2, 2017

Related U.S. Application Data

(60) Provisional application No. 62/213,454, filed on Sep. 2, 2015.

(51) Int. Cl.
*G01R 15/18* (2006.01)

(52) U.S. Cl.
CPC .................. *G01R 15/181* (2013.01)

(58) Field of Classification Search
None
See application file for complete search history.

(56) References Cited

U.S. PATENT DOCUMENTS

| | | | |
|---|---|---|---|
| 4,709,339 A * | 11/1987 | Fernandes | G01K 1/024 324/127 |
| 5,414,400 A | 5/1995 | Gris et al. | |
| 5,852,395 A * | 12/1998 | Bosco | G01R 15/181 336/174 |
| 6,313,623 B1 | 11/2001 | Kojovic et al. | |
| 6,614,218 B1 * | 9/2003 | Ray | G01R 15/181 324/117 R |
| 7,227,441 B2 | 6/2007 | Skendzic et al. | |
| 7,227,442 B2 | 6/2007 | Skendzic | |
| 7,538,541 B2 | 5/2009 | Kojovic | |
| 7,564,233 B2 | 7/2009 | Kojovic | |
| 7,902,812 B2 | 3/2011 | Kojovic | |
| 7,986,968 B2 | 7/2011 | Dobrowski et al. | |
| 8,324,883 B2 * | 12/2012 | Turpin | G01R 15/181 324/117 H |
| 8,330,449 B2 | 12/2012 | Greenberg | |
| 8,872,611 B2 | 10/2014 | Rouaud et al. | |
| 9,329,659 B2 | 5/2016 | Cook | |
| 9,442,139 B2 | 9/2016 | Hobelsberger et al. | |
| 9,448,258 B2 | 9/2016 | Garabieta et al. | |
| 2004/0055395 A1 * | 3/2004 | Tankard | G01R 15/181 73/862 |
| 2004/0183522 A1 | 9/2004 | Gunn | |
| 2008/0191704 A1 | 8/2008 | Gholami et al. | |
| 2011/0012587 A1 | 1/2011 | Greenberg | |
| 2011/0043190 A1 | 2/2011 | Farr | |
| 2015/0002138 A1 * | 1/2015 | Fox | G01R 15/142 324/149 |

(Continued)

FOREIGN PATENT DOCUMENTS

| WO | 2006108021 A2 | 10/2006 |
|---|---|---|
| WO | 2012022779 A1 | 2/2012 |

*Primary Examiner* — Paresh Patel
(74) *Attorney, Agent, or Firm* — Chernoff, Vilhauer, McClung & Stenzel, LLP

(57) ABSTRACT

A coil that includes an alarm.

18 Claims, 28 Drawing Sheets

(56) References Cited

U.S. PATENT DOCUMENTS

| | | |
|---|---|---|
| 2016/0055963 A1 | 2/2016 | Lockstedt et al. |
| 2016/0091535 A1 | 3/2016 | Bannister et al. |
| 2016/0202291 A1* | 7/2016 | Gilbert .............. G01R 1/0416 324/750.25 |
| 2017/0059620 A1 | 3/2017 | Cook |
| 2017/0059621 A1 | 3/2017 | Cook |
| 2017/0059622 A1 | 3/2017 | Cook |
| 2017/0059623 A1 | 3/2017 | Cook |
| 2017/0059625 A1 | 3/2017 | Cook |

* cited by examiner

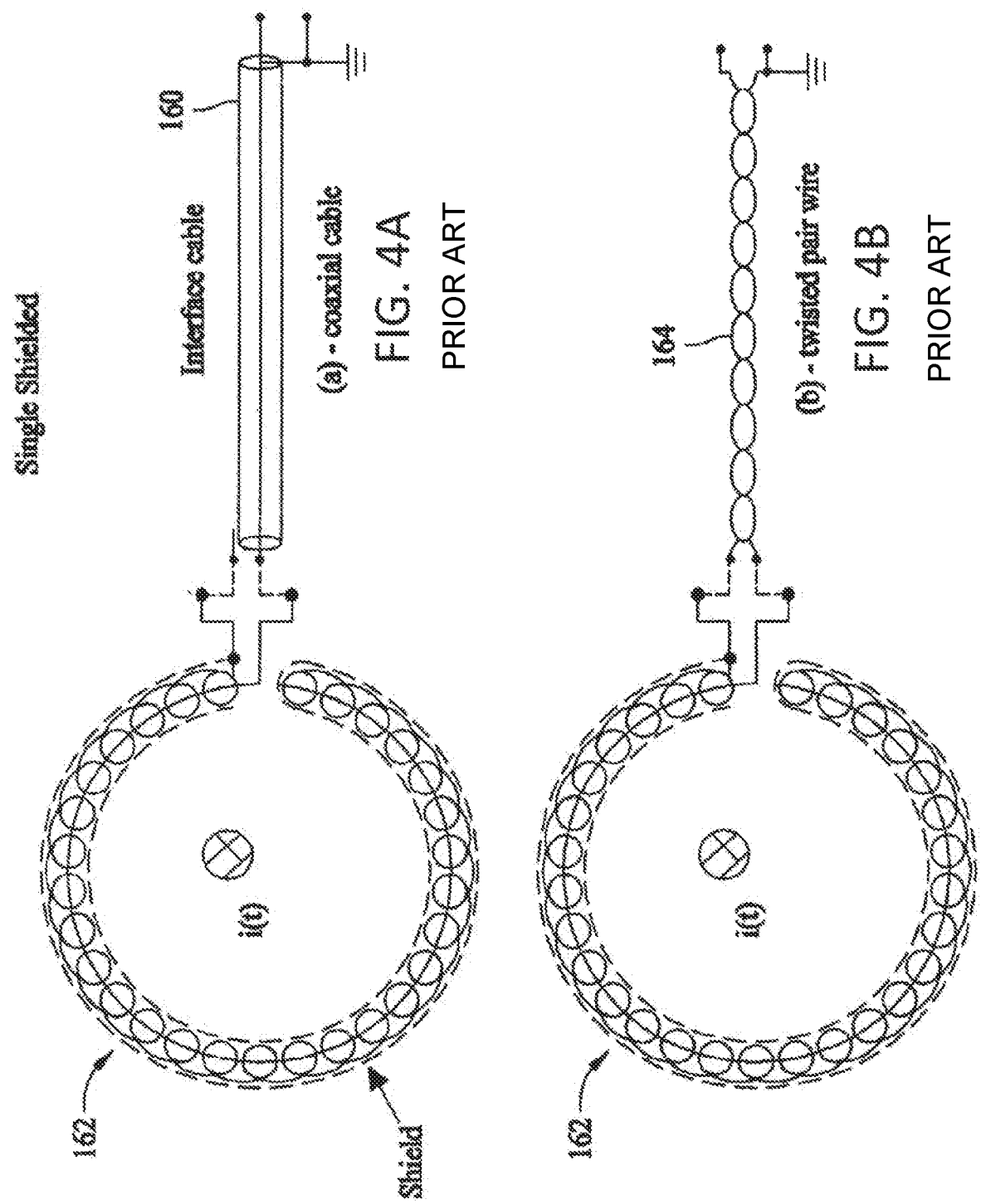

ROGOWSKI COIL BASED ALARM SYSTEM

CROSS-REFERENCE TO RELATED APPLICATIONS

This application claims the benefit of U.S. Provisional App. No. 62/213,454, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 4A illustrates a further modified Rogowski coil and connection.
FIG. 4B illustrates a further modified Rogowski coil and connection.

DETAILED DESCRIPTION OF PREFERRED EMBODIMENT

Figure 1:
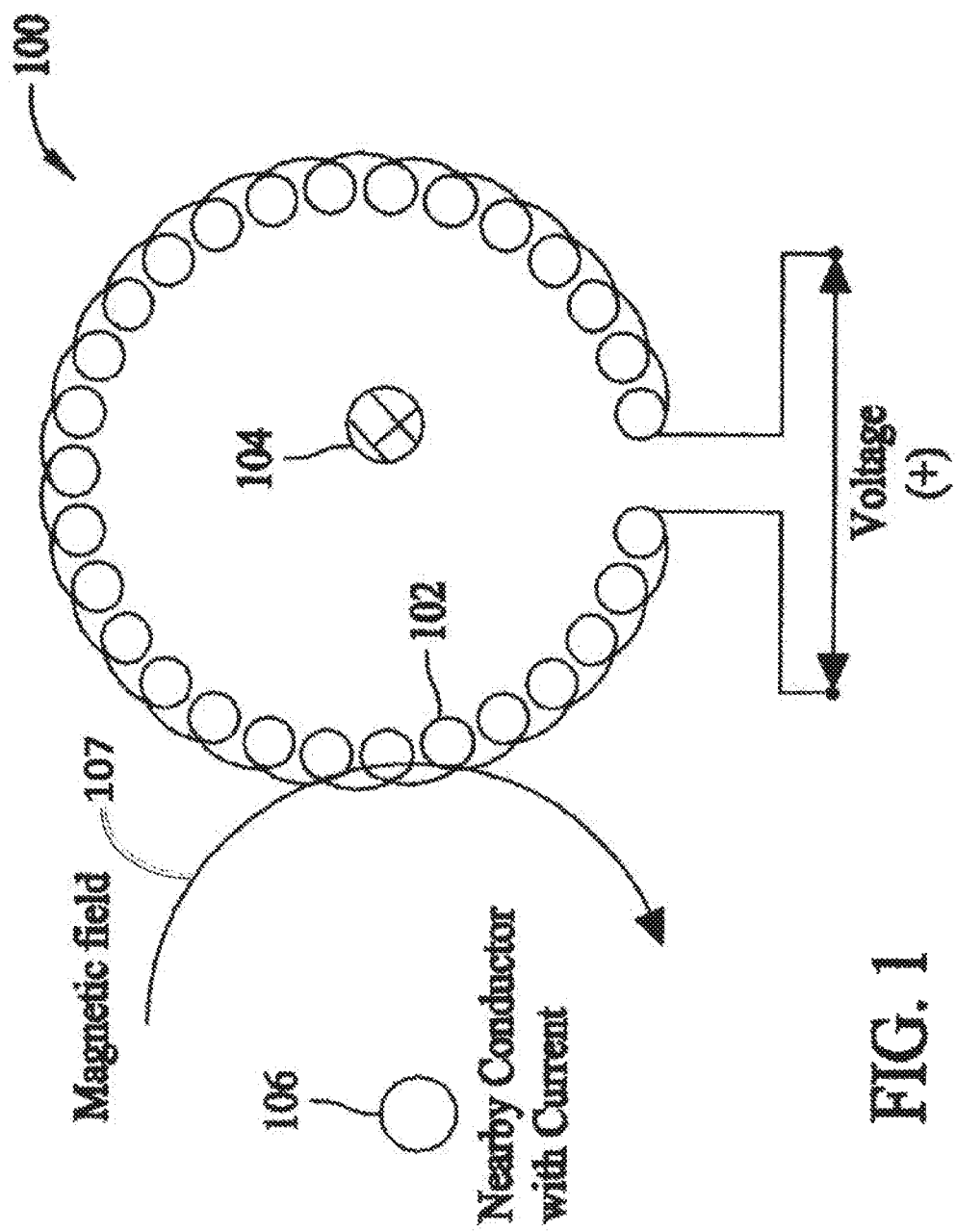
FIG. 1 illustrates a Rogowski coil, an internal conductor, and an external conductor.

Referring to FIG. 1, a Rogowski coil 100 is generally fabricated from a conductor 102, that may include a wire, that is coiled or wound on a substantially non-magnetic core, which may be, for example, air or a substantially non-magnetic material. The 102 coil may be placed around a conductor or conductors 104 whose current(s) is to be measured with the coil 102. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r n S [d\, i(t)/d\, t] = -M[d\, i(t)/d\, t].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Figure 2B:
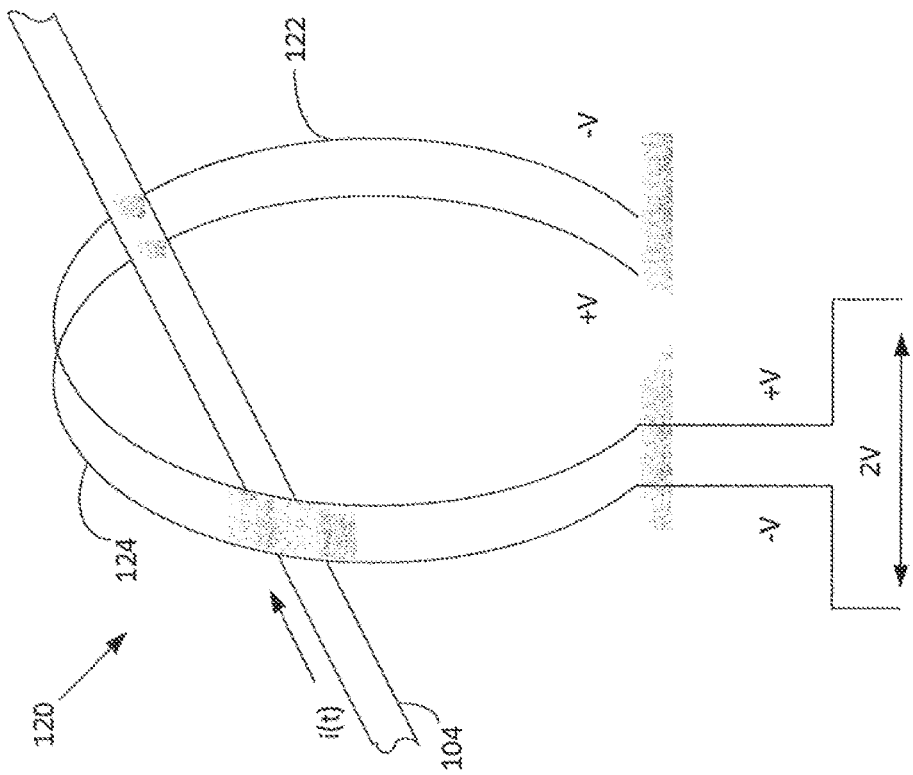
FIG. 2B illustrates a further modified Rogowski coil.
Figure 2A:
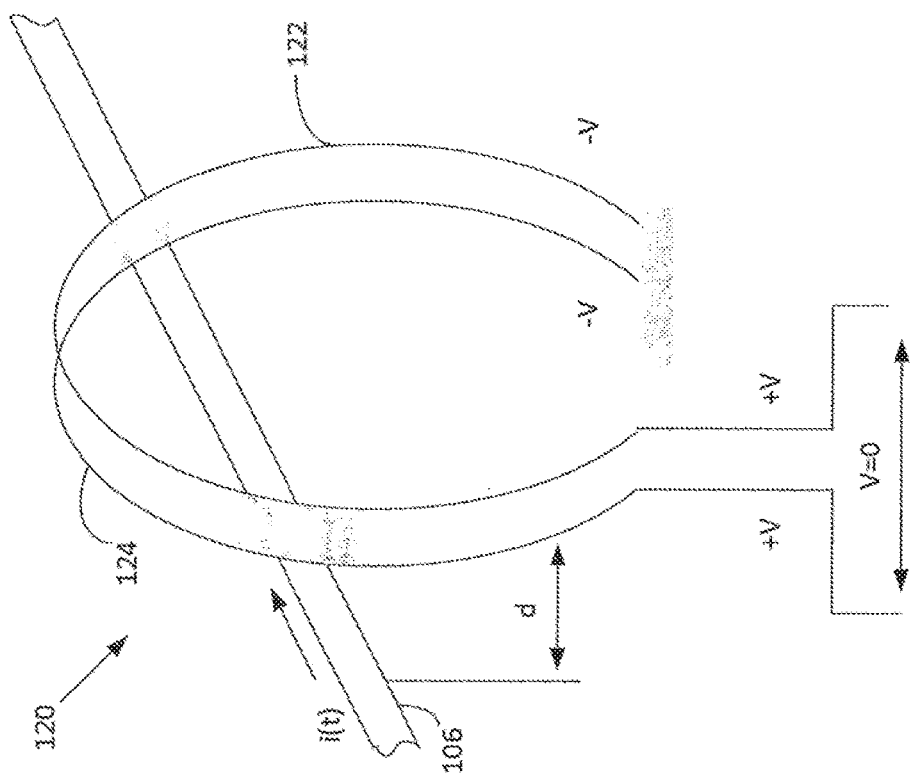
FIG. 2A illustrates a modified Rogowski coil.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
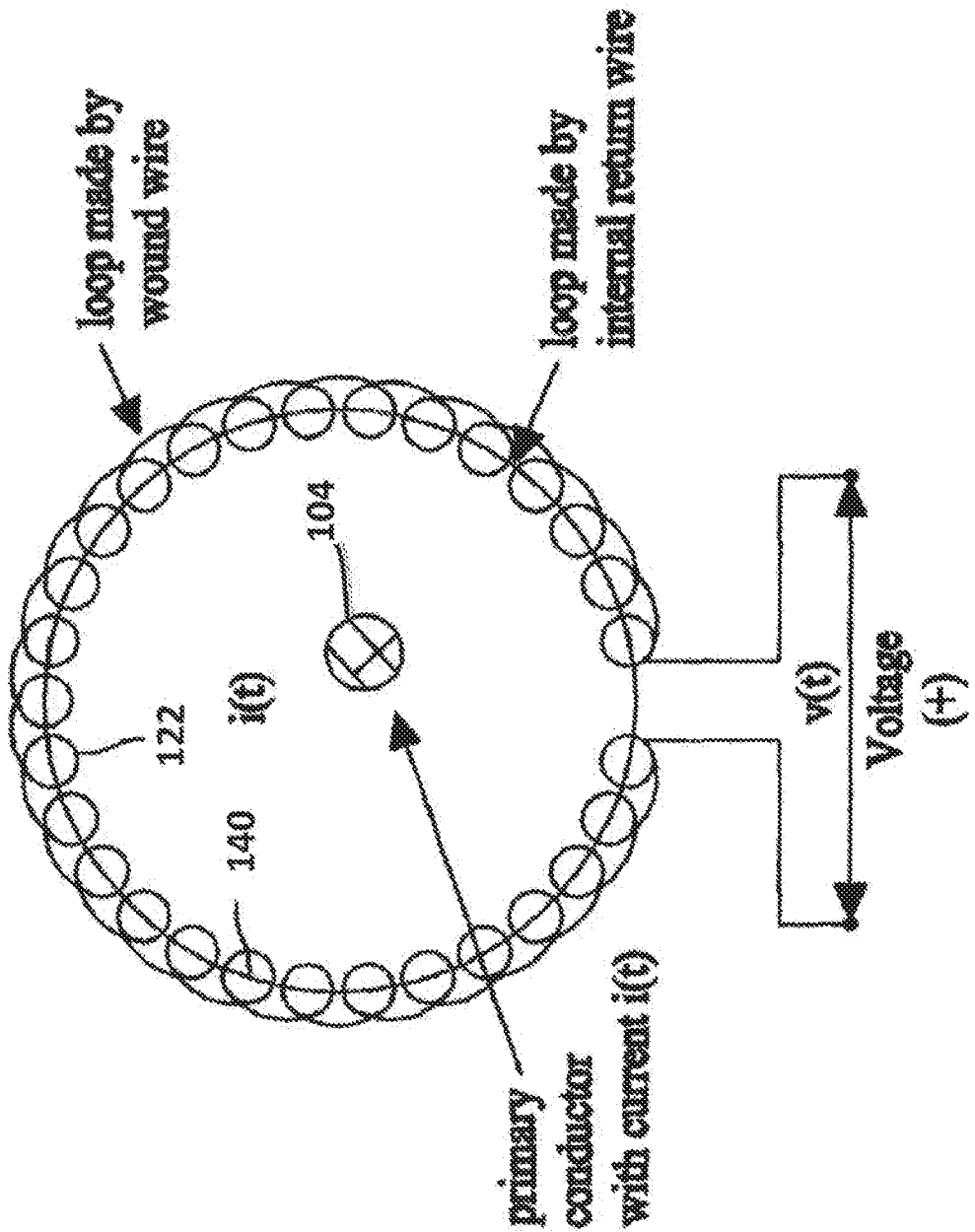
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The output of the coils tend to be susceptible to noise, signal distortion, and undesirable influences by surrounding conductors and equipment in the vicinity of the coils. To reduce such influences shielding may be included.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

Figures 5A, 5B:
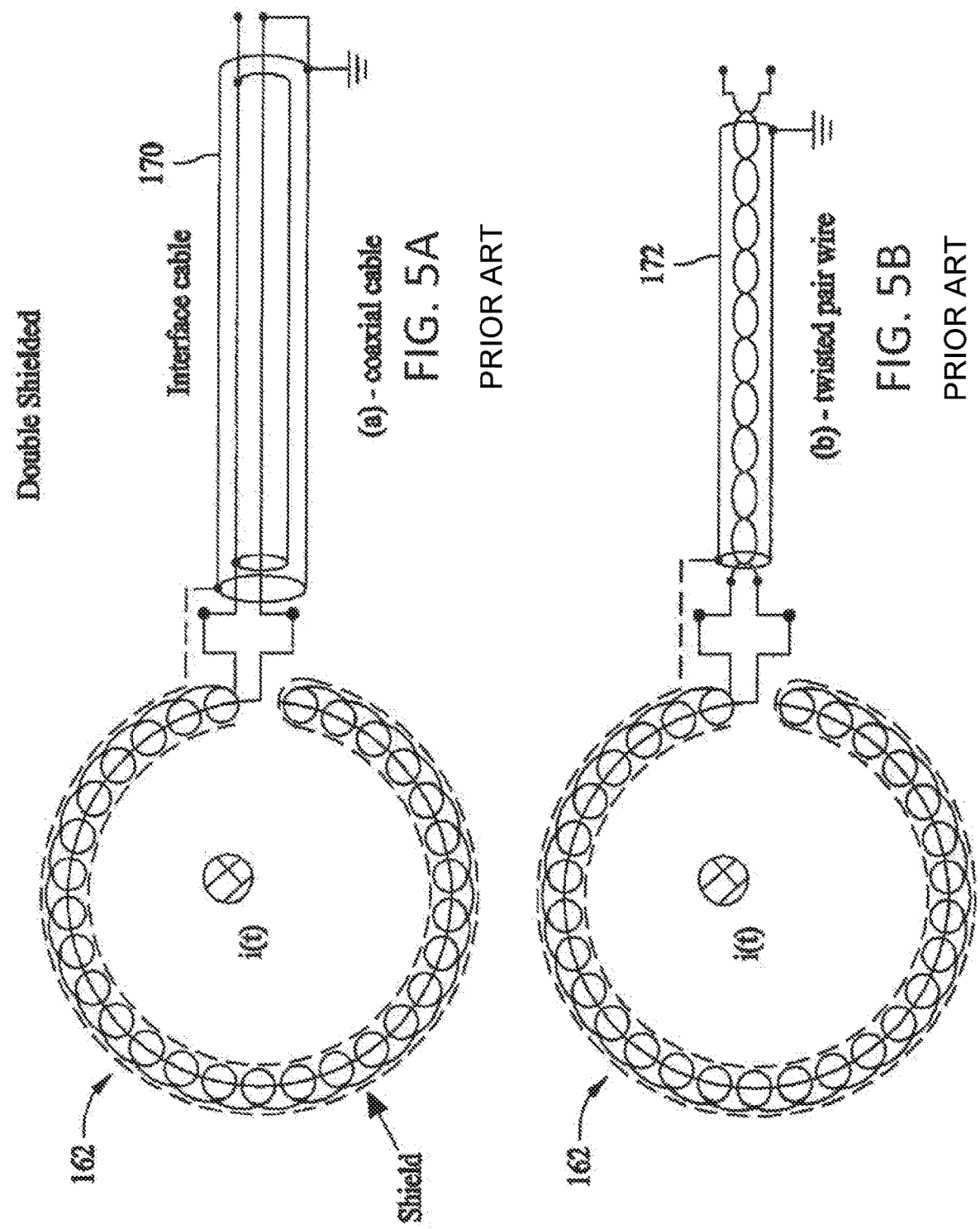
FIG. 5A illustrates a further modified Rogowski coil and connection.
FIG. 5B illustrates a further modified Rogowski coil and connection.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
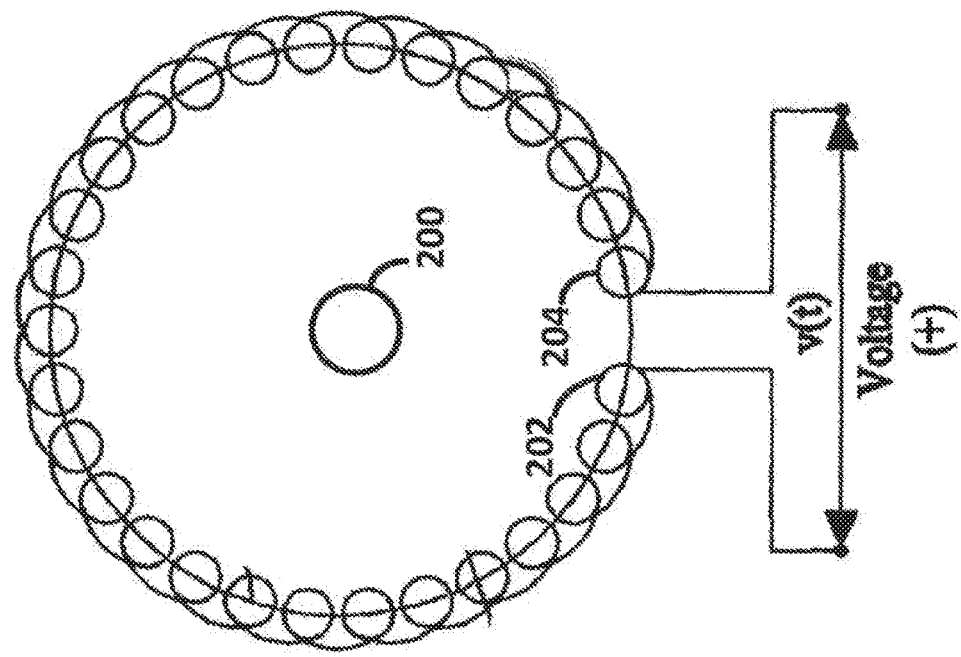
FIG. 6 illustrates a further modified Rogowski coil and connection.
Figure 7:
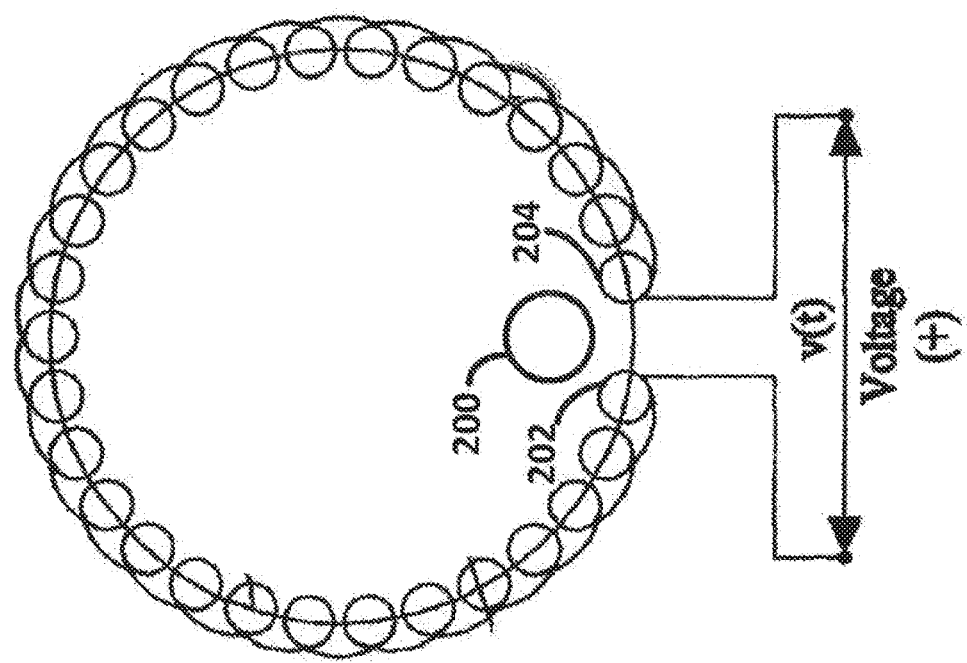
FIG. 7 illustrates a further modified Rogowski coil and connection.
Figure 8:
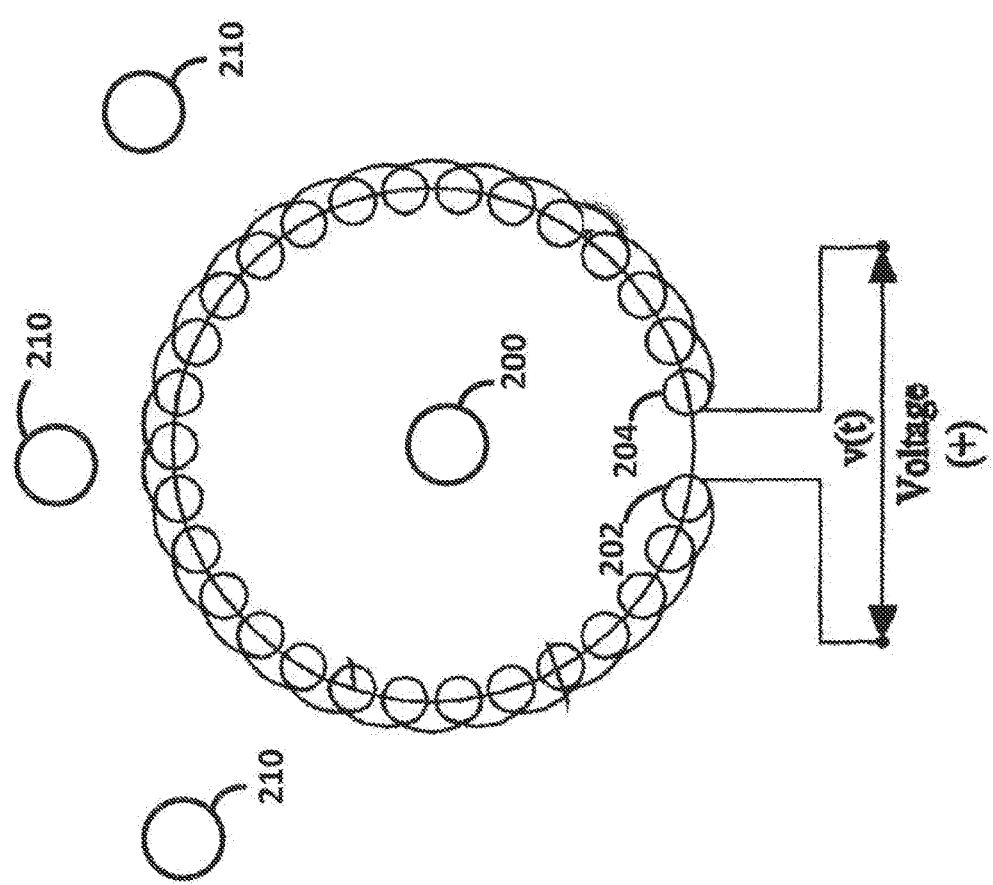
FIG. 8 illustrates a further modified Rogowski coil and connection.

As described, the Rogowski coil may be flexible in shape in order to readily open and close it on the conductor to be measured. This flexibility is especially useful when installing the Rogowski coil around conductors with limited or irregular space constraints. However, the closure system between the ends of the loops from a mechanical perspective (e.g., precision of the positioning of the two ends of the loop) and from an electrical perspective (e.g., the electrical discontinuity of the electrical fields) results in a non-uniformity of the measuring of the fields within the loop. Referring to FIG. 6, a first measurement may be made based upon a first conductor 200 centered within the loop. The measurement will be incorrect due to the non-uniform field created by the closure system between the ends 202, 204 of the loop. Referring to FIG. 7, a second measurement may be made based upon the first conductor 200 located proximate the closure system within the loop. The measurement will be incorrect due to the non-uniform fields created by the closure system within the loop. Referring to FIG. 8, the measurement tends to be incorrect, even with external fielding canceling techniques, due to the non-uniform field created by one or more external conductors 210 in addition to the non-uniform field created by the closure system between the ends 202, 204 of the loop.

Figure 9:
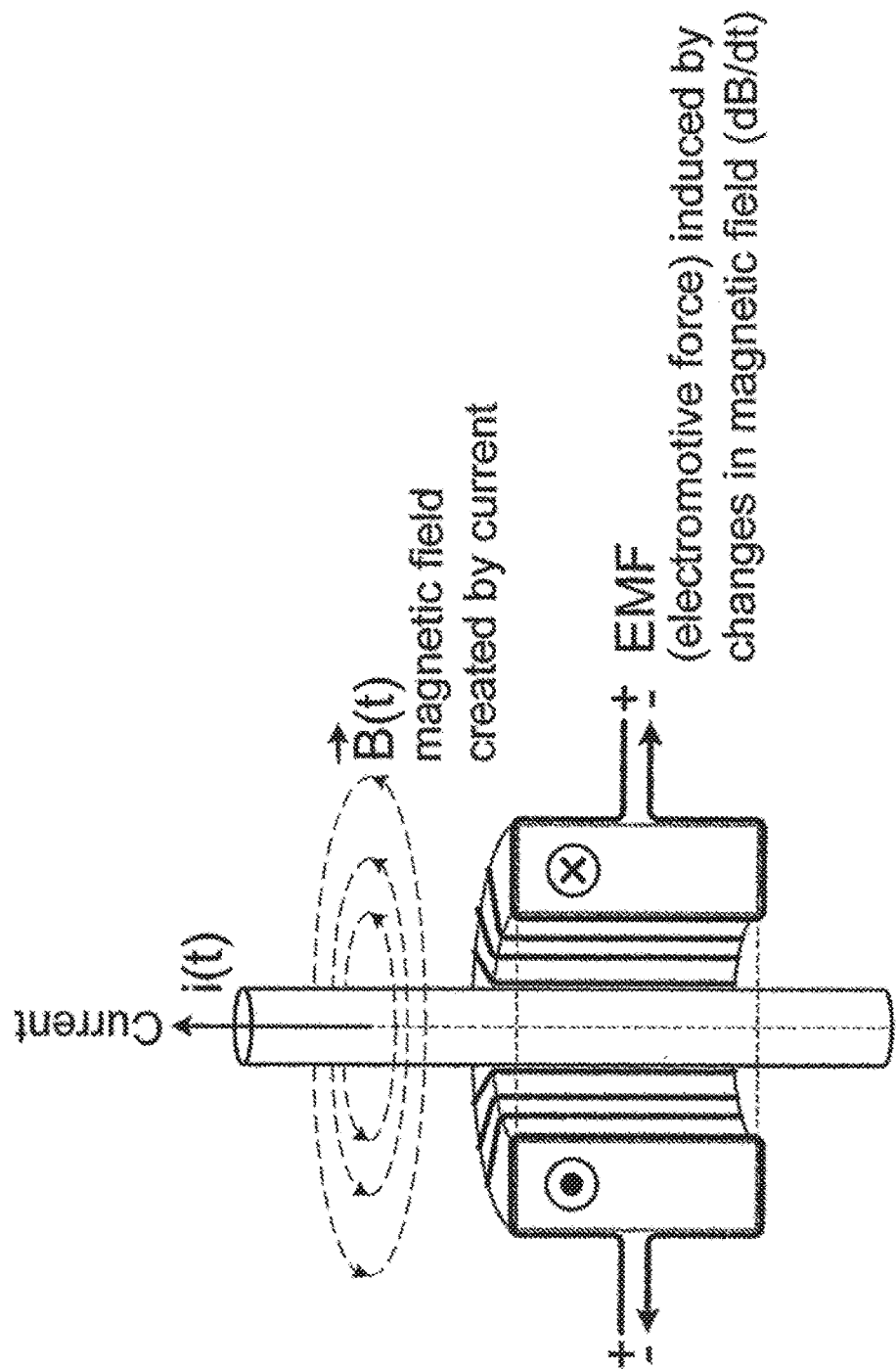
FIG. 9 illustrates a Rogowski coil and its electromotive force.

Referring to FIG. 9, an exemplary diagram of a Rogowski coil arranged around a long straight wire perpendicular to the magnetic field is shown, illustrating the magnetic field (B field) generated by the current i(t). Moreover, as previously described, the EMF may be generally determined by EMF=−Md(i)/dt.

Figure 10:
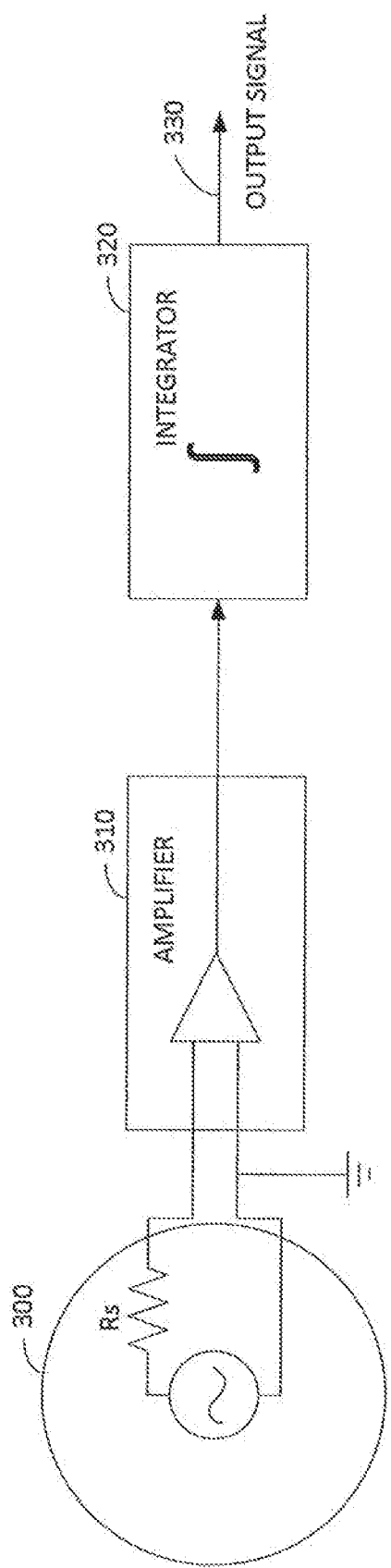
FIG. 10 illustrates a Rogowski coil, together with an amplifier and an integrator.

Referring to FIG. 10, since the output signal from the Rogowski coil 300 tends to be relatively small the signal is preferably amplified using a suitable amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil. It is to be understood that the amplification and/or integration may be performed using firmware using any computing process.

Figure 11:
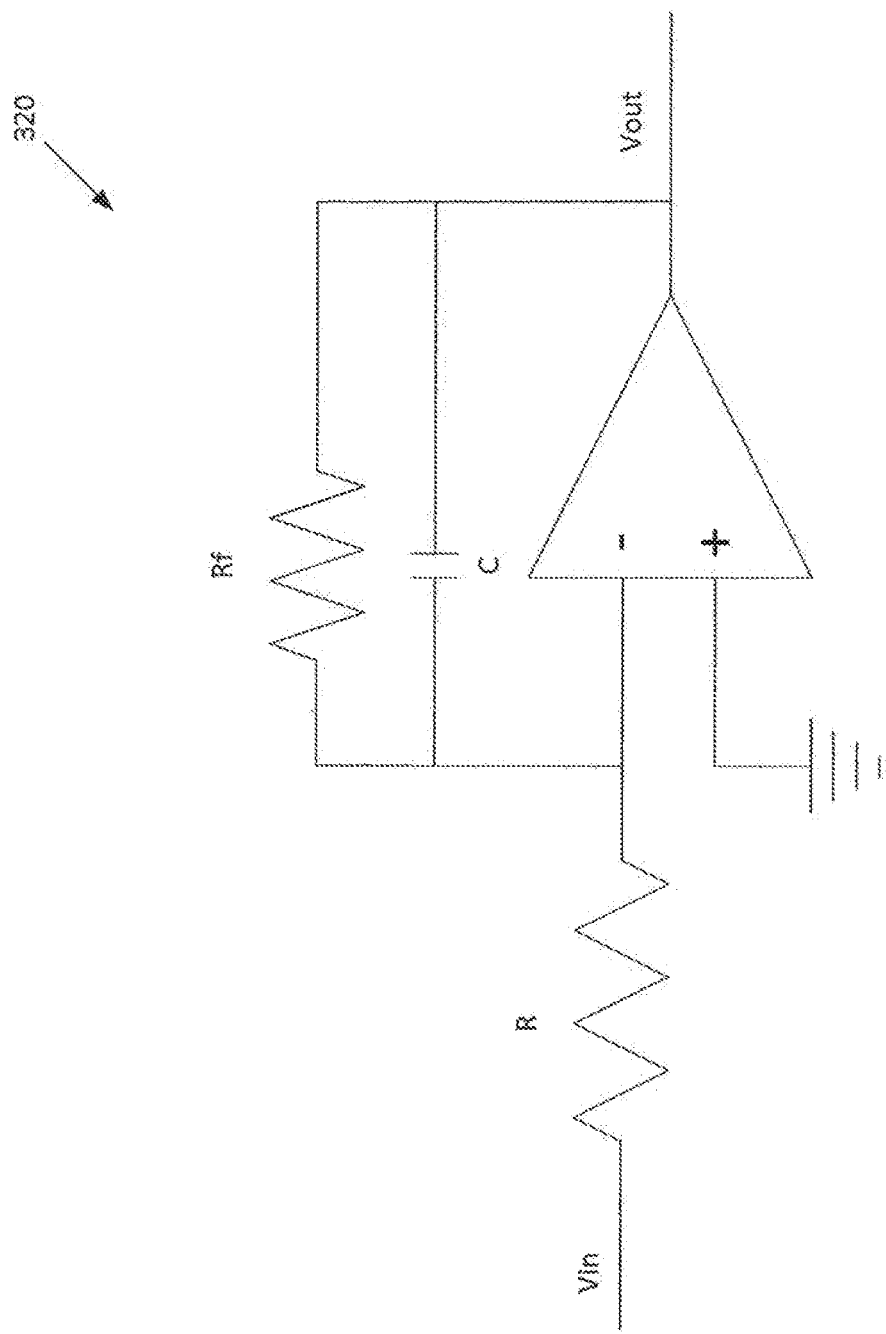
FIG. 11 illustrates an integrator.

Referring to FIG. 11, an exemplary integrator 320 may include an inverting operational amplifier and a resistor-capacitor circuit.

Figure 12:
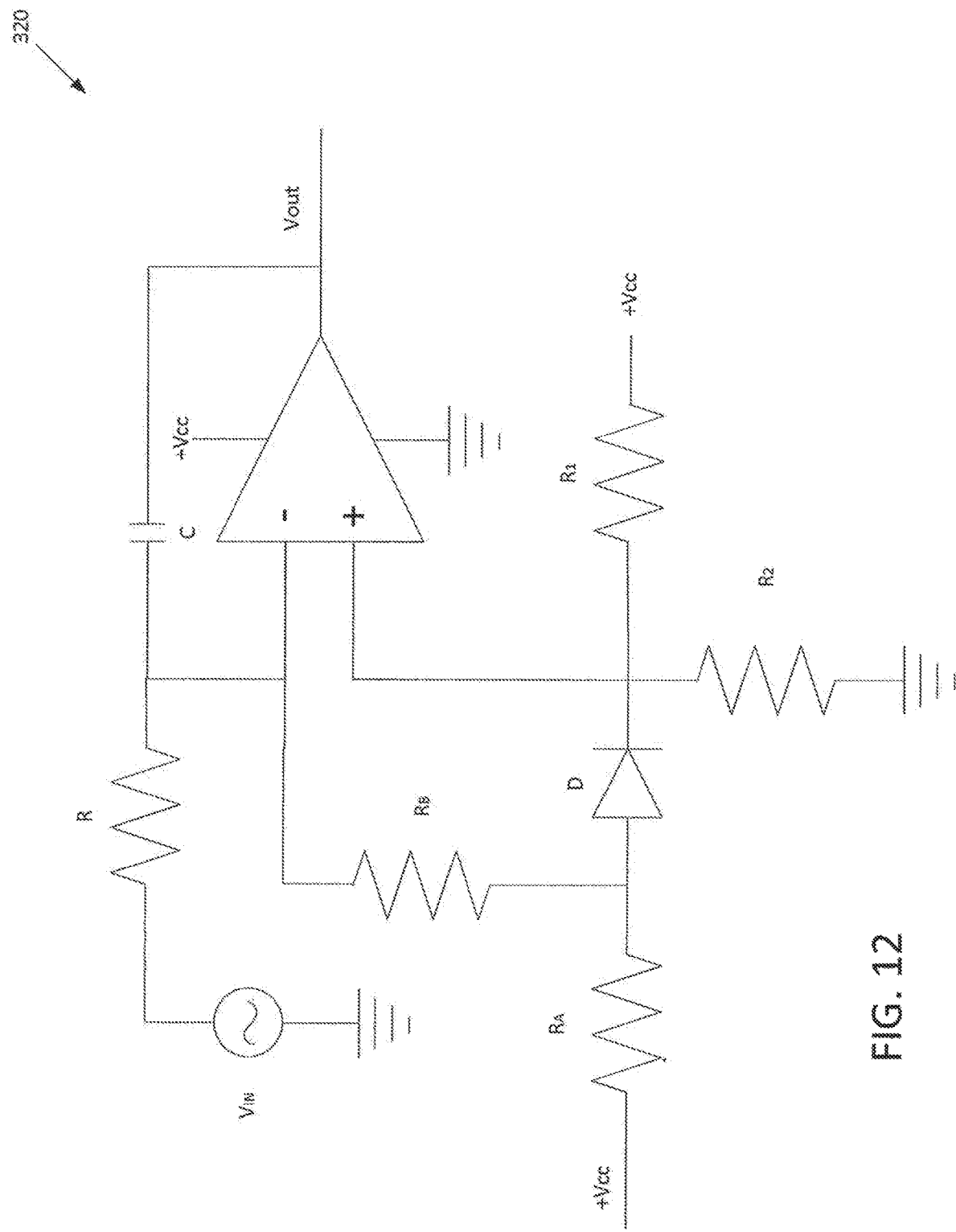
FIG. 12 illustrates another integrator.

Referring to FIG. 12, an exemplary integrator 320 may include an operational amplifier with input current compensation. The resistors R1 and R2 are relatively small, and the resistor $R_B$ is relatively large.

Figure 13:
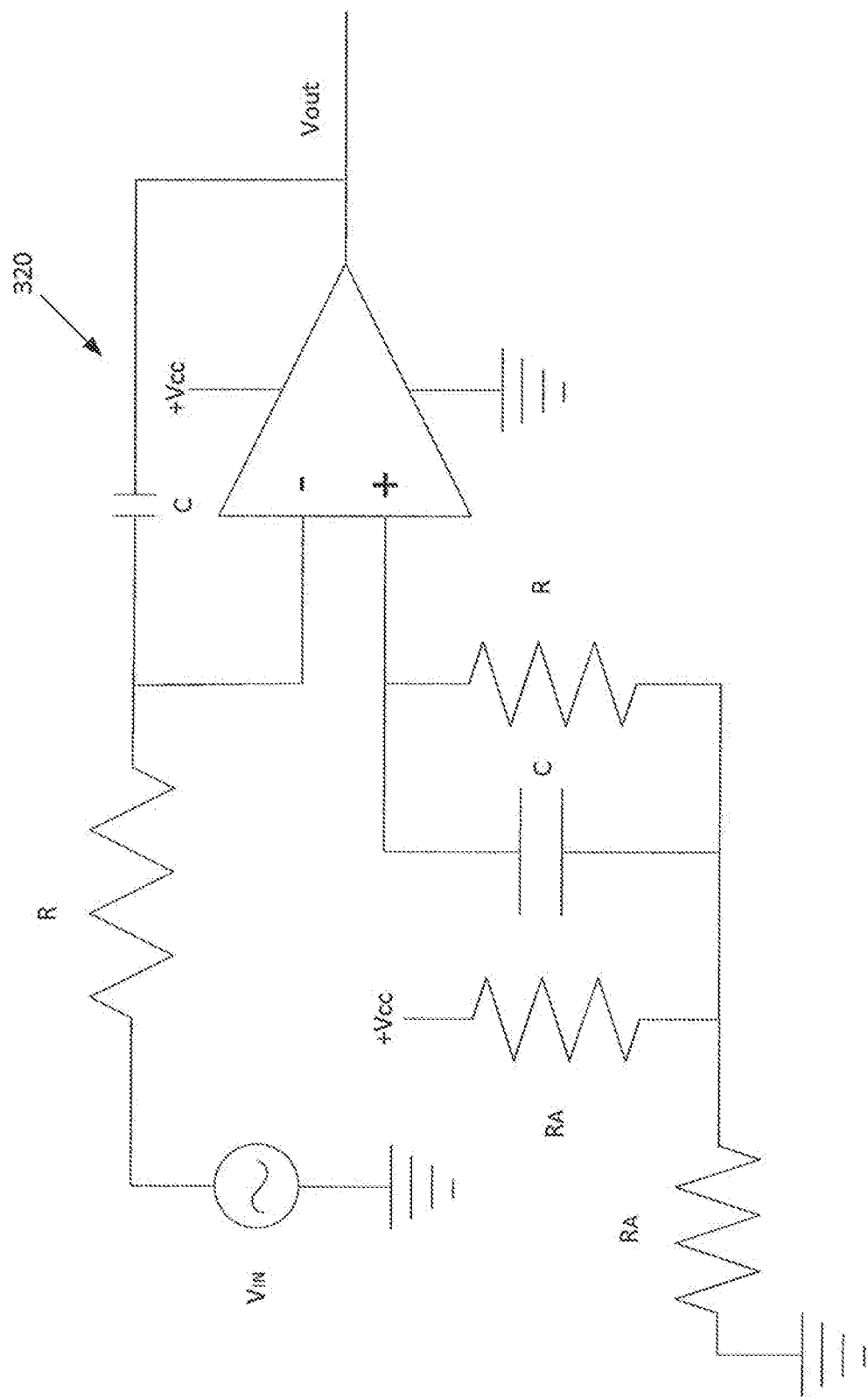
FIG. 13 illustrates another integrator.

Referring to FIG. 13, an exemplary integrator 320 may include an operational amplifier with drift compensation. The positive input current drops the same voltage across the parallel RC combination as the negative input current drops across its series RC combination.

Figure 14A:
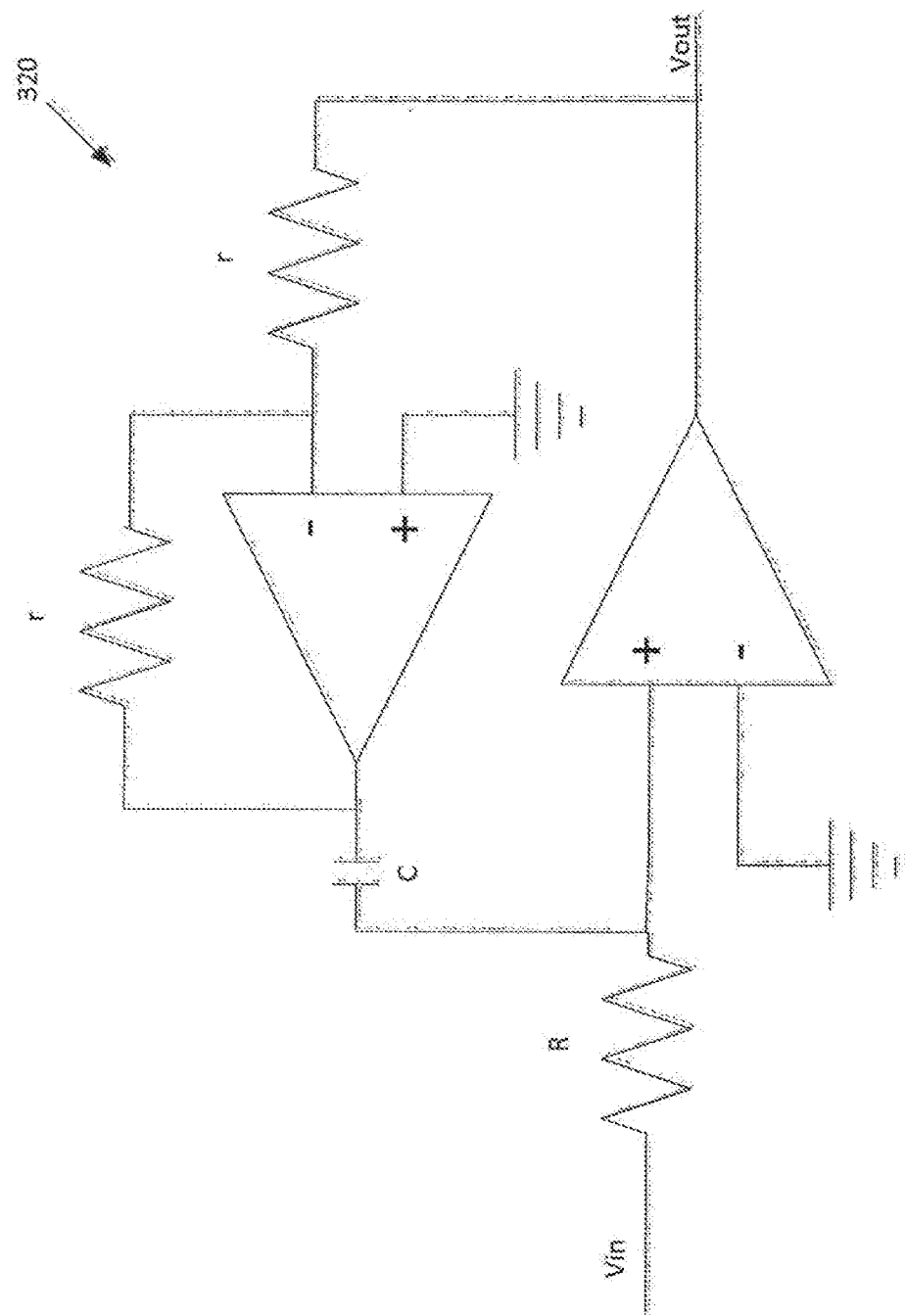
FIGS. 14A-B illustrate other integrators.
Figure 14B:
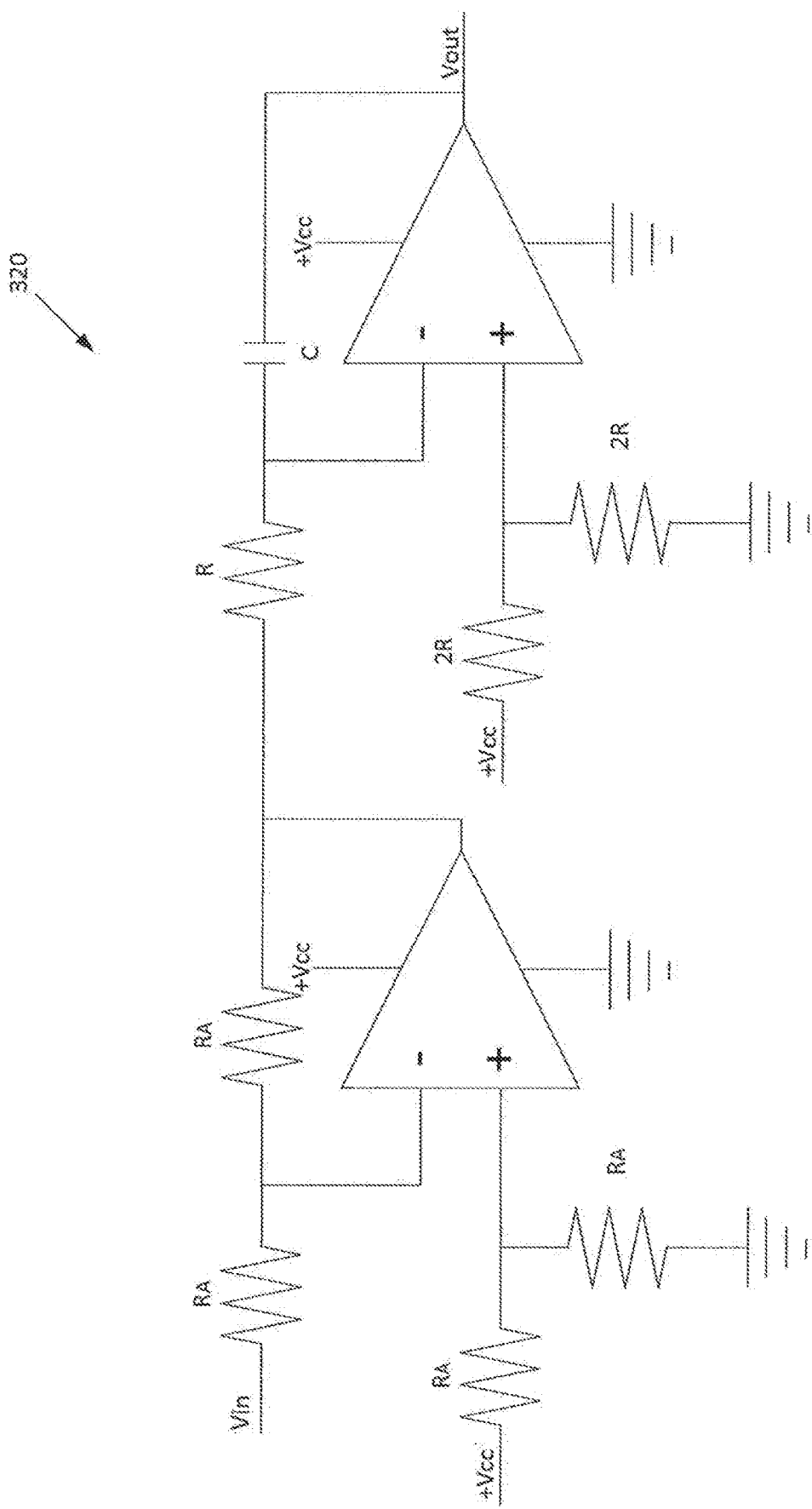

Referring to FIGS. 14A-B, an exemplary integrator 320 may include two operational amplifiers with a non-inverting integrator and an inverting buffer.

Figure 15:
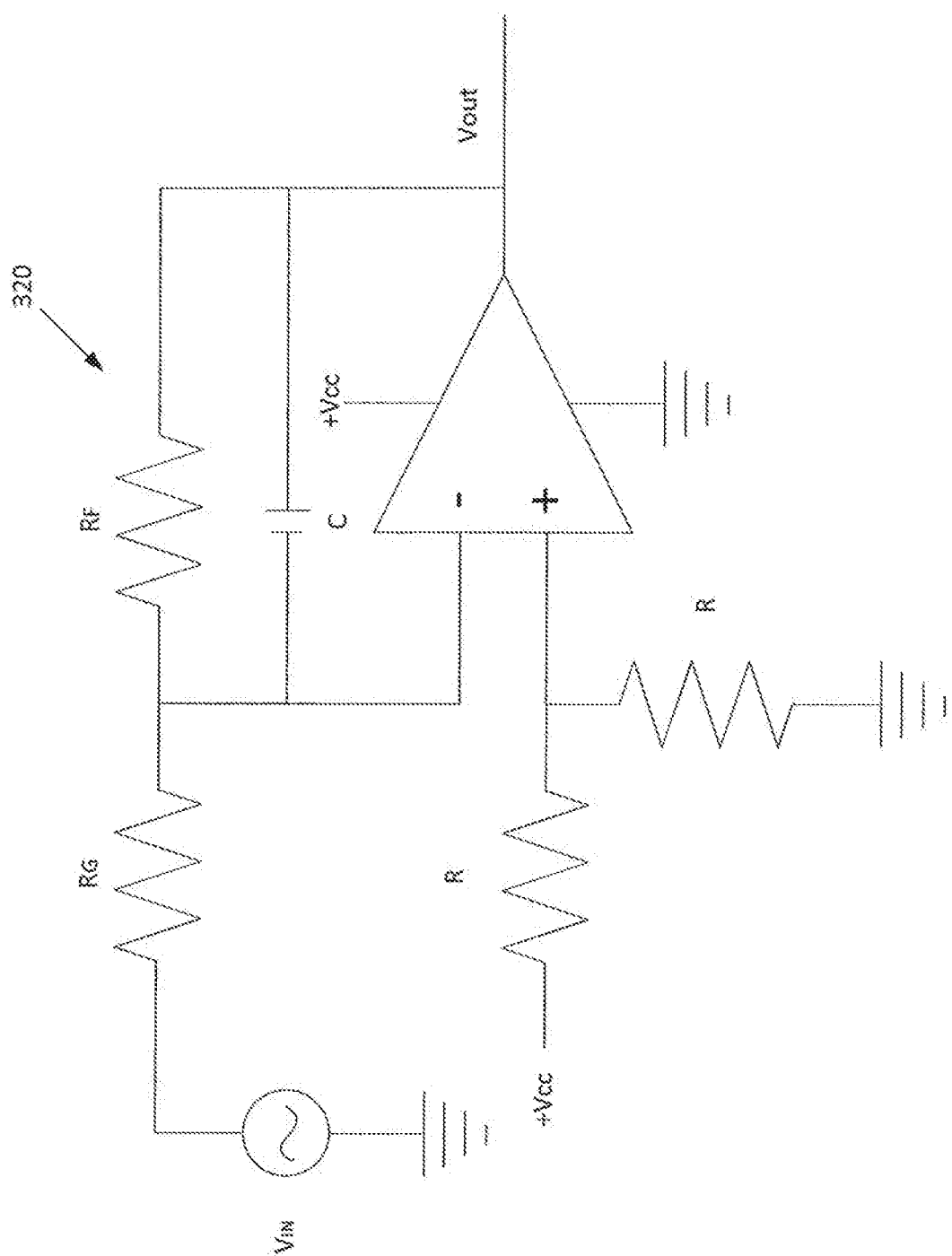
FIG. 15 illustrates another integrator.

Referring to FIG. 15, an exemplary integrator 320 may include an operational amplifier with an inverting integrator with a resistive reset.

Figure 16:
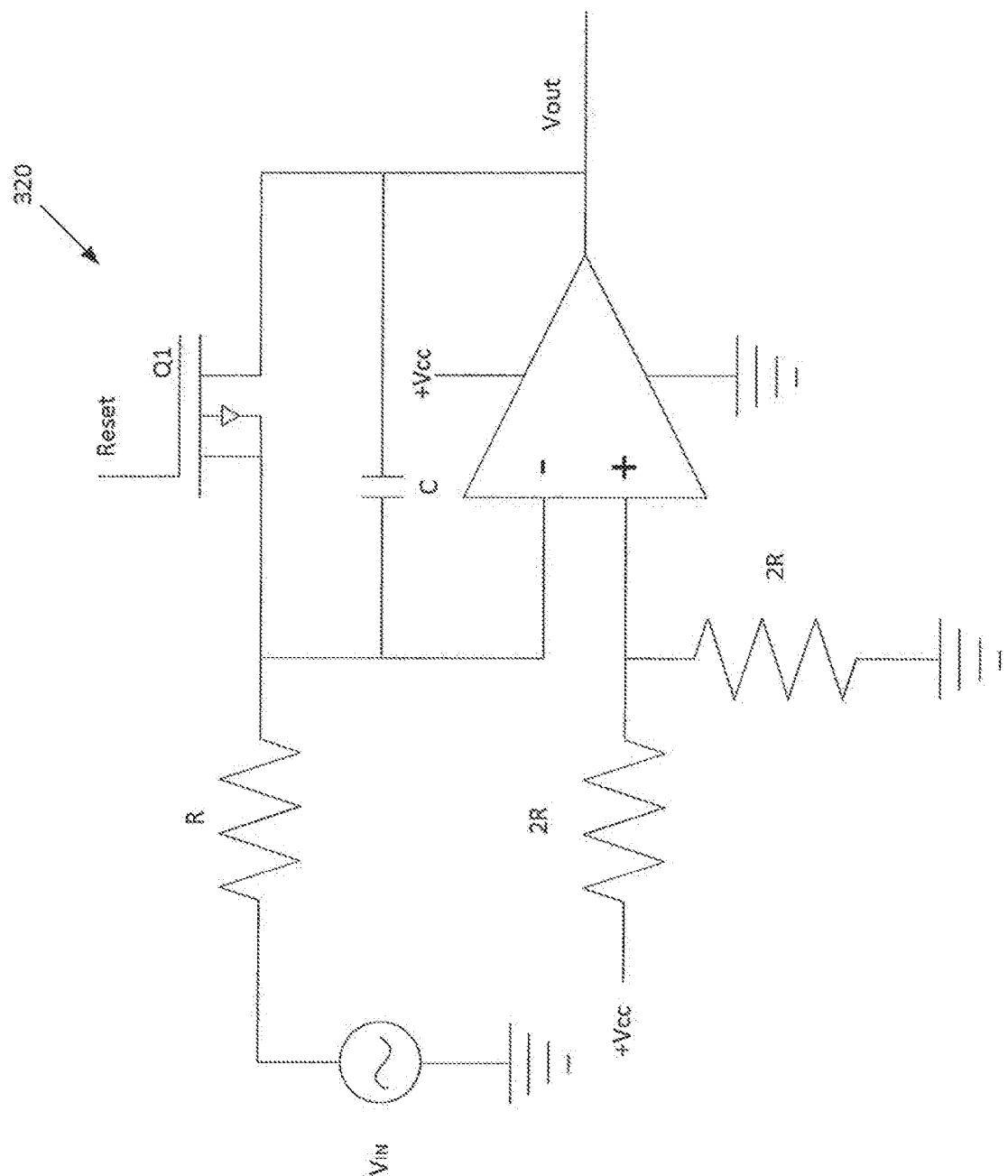
FIG. 16 illustrates another integrator.

Referring to FIG. 16, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

Figure 17:
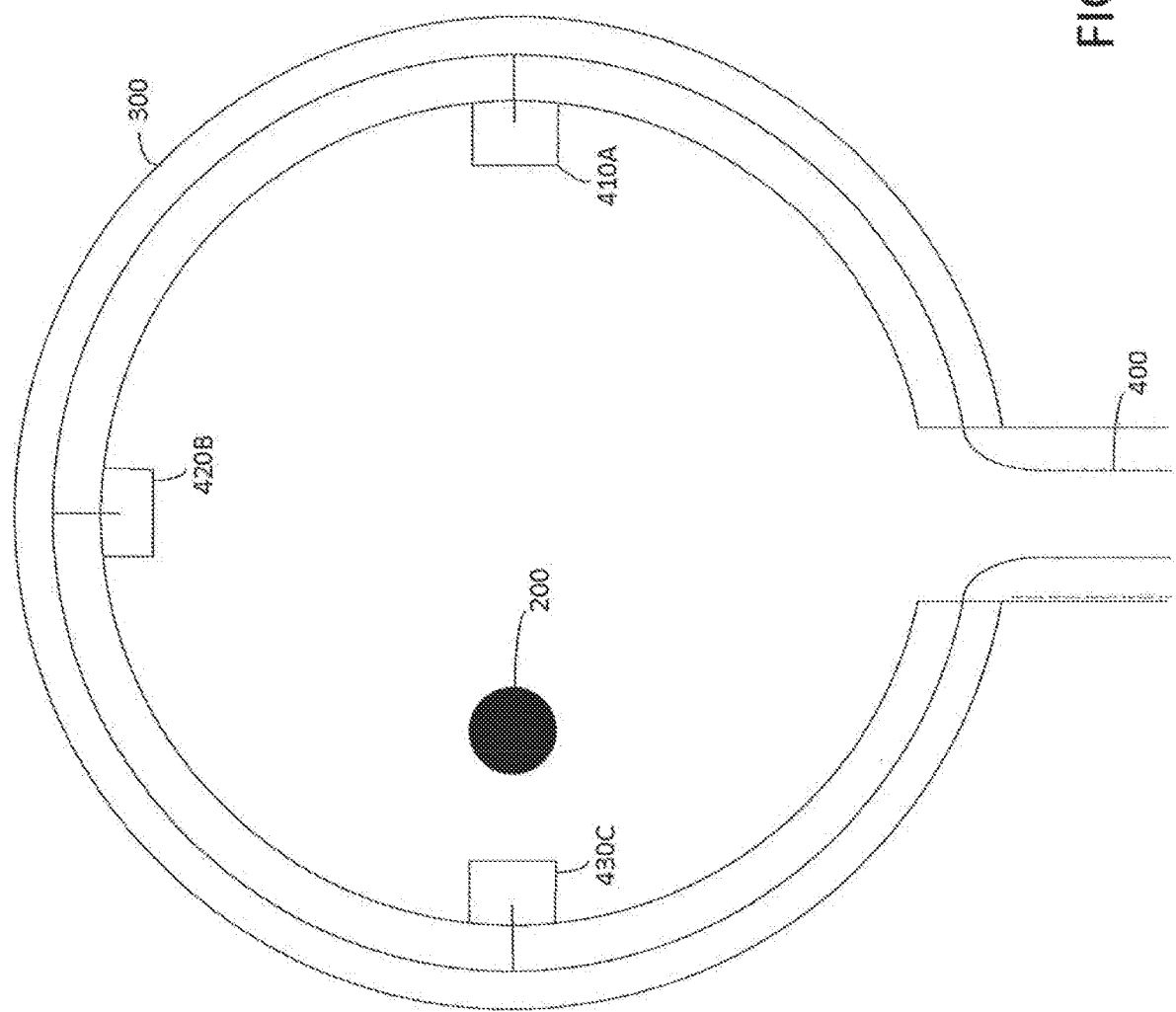
FIG. 17 illustrates a Rogowski coil with a plurality of sensors.

Referring to FIG. 17, the Rogowski coil 300 may include one or more additional conductors 400 that extend along the length of the coil 300 to provide power to a set of spaced apart sensors 410, 420, and/or 430. Preferably, the coil supports at least three sensors 410, 420, 430, although fewer or additional sensors may be included, as desired. The sensors are preferably maintained at a fixed position with respect to the coil 300 and are not movable with respect to the coil 300. In this manner, the spatial relationship of the sensors relative to one another along the length of the coil is generally known. Moreover, when the sensors 410, 420, 430 are arranged in a generally circular arrangement the spatial relationship of the sensors 410, 420, 430 with respect to one another is also generally known. In addition, the spatial relationship of the sensors 410, 420, 430 with respect to the closure system between the ends of the coil 300 is also generally known.

Each of the sensors 410, 420, 430 may measure the magnitude of the magnetic field generated by the conductor 200 at spaced apart locations, such as for example, RMS. For example, sensor 430 may measure the magnitude of the conductor 200 as C; sensor 420 may measure the magnitude of the conductor 200 as B; and sensor 410 may measure the magnitude of the conductor 200 as A, where each of the sensors are similarly calibrated. Since the conductor 200 is not centered within the coil 300, each of the sensors 410, 420, 430, will sense a different magnitude. The magnitude C will be greater than the magnitude B, which in turn will be greater than the magnitude A. Based upon the positions of the sensors relative to one another, together with the sensed magnitudes, the position of the conductor 200 within the coil 300 may be determined. If desired, the sensors may be powered by the same power that is used for the amplifier and/or integrator. The signals indicative of the sensed power within the conductor 200 from each of the sensors 410, 420, 430, may be provided along one or more of the conductors 400. Also, the sensors 410, 420, 430 may be unpowered spaced apart sensors where the amplifier and/or integrator is used to obtain a sensed signal from each.

Figure 18:
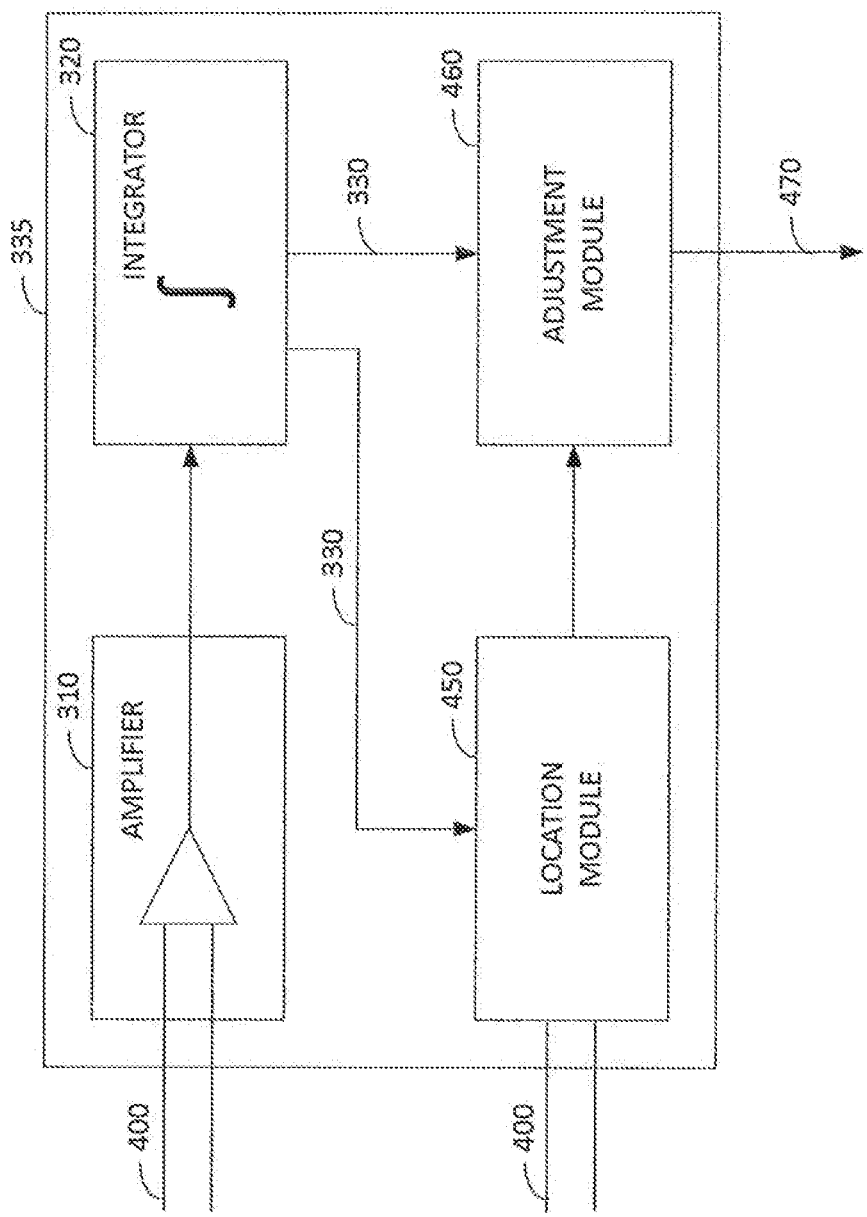
FIG. 18 illustrates an amplifier, integrator, location module, and adjustment module.

Referring to FIG. 18, each of the output signals from the coil may be amplified 310 and integrated 320, as previously described. Each of the output signals may be separately amplified and/or time multiplexed by a single amplifier (e.g., two or more output signals for each amplifier and/or integrator). The magnitude of the output signals 330 are different based upon the location of the wire within the Rogowski coil in addition to the wire's proximity to the closure portion, if desired. A location module 450 receives the data from the sensors 410, 420, 430, such as for example, the amplified and integrated signal from each of the sensors, and determines the relative location of the conductor 200 within the coil 400. For example, the signals from the current sensors may be separately amplified and/or integrated to determine an overall magnitude for the signal in the wire. For example, the signals from the current sensors may be averaged together or summed together or otherwise, to obtain a form of a composite signal which is then amplified and/or integrated. An adjustment module may receive the signals from the location module 450 and use such data to modify the output signals 330 to determine an appropriate signal for the coil 400 indicative of its magnitude. The location module 450 and the adjustment module 460 may be combined, as desired.

Figure 19:
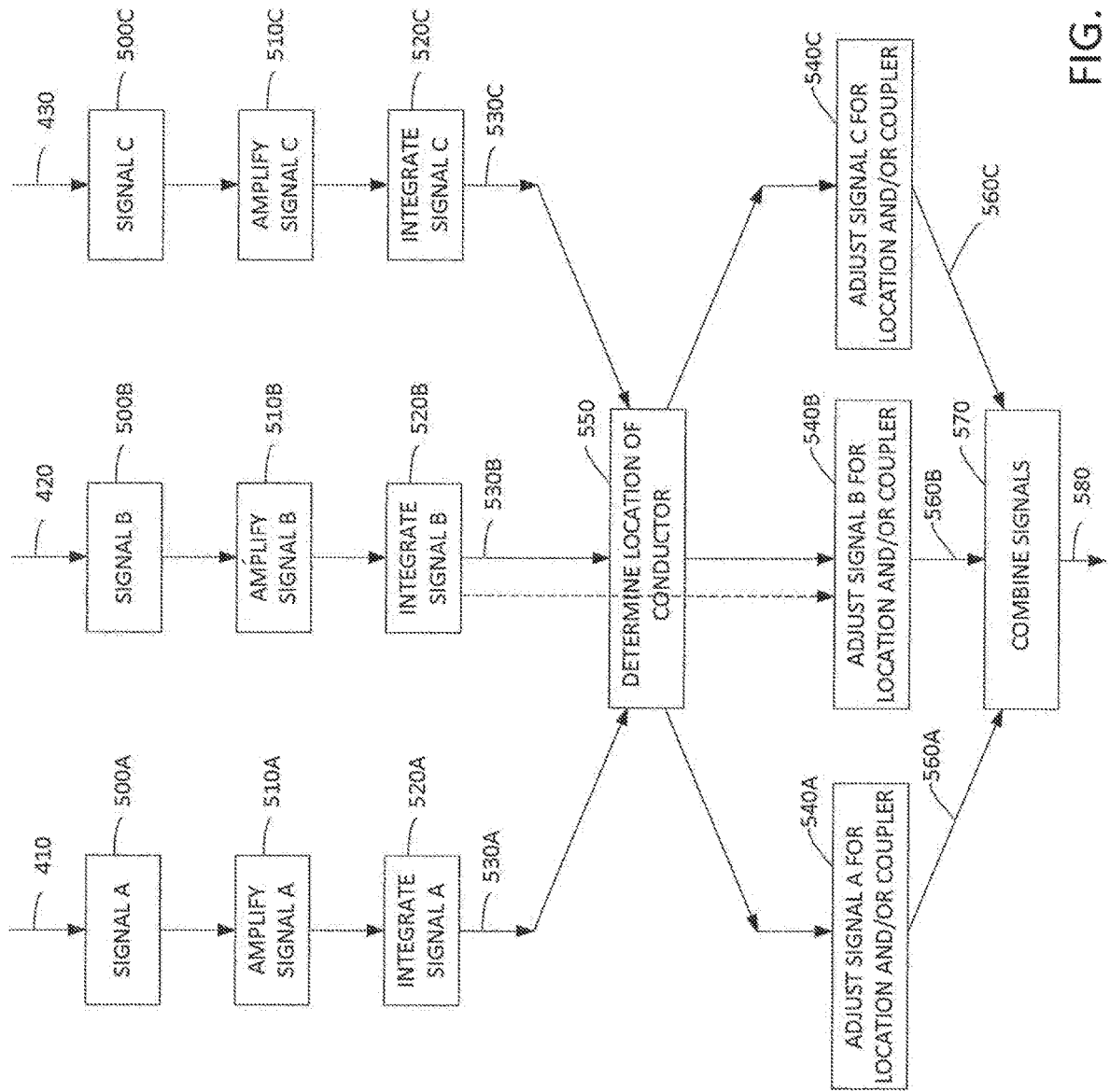
FIG. 19 illustrates another Rogowski coil with a plurality of sensors.

Referring to FIG. 19, one technique to process the signals from the sensors is illustrated. The signal A 500A from sensor 410 is amplified 510A and integrated 520A, the signal B 500B from sensor 420 is amplified 510B and integrated 520B, and the signal C 500C from sensor 430 is amplified 510C and integrated 520C.

The sensor A 410 which is the basis for an integrated signal A 530A has a generally known relationship to the coupler and therefore an approximate adjustment factor 550 may be determined based upon the location of the conductor relative to the coupler. For example, the signal A may be adjusted by a first factor 540A to adjust for the lack of magnetic coupling by the coupler.

The sensor B 420 which is the basis for the integrated signal B 530B has a generally known relationship to the coupler and therefore an approximate adjustment factor 550 may be determined based upon the location of the conductor relative to the coupler. For example, the signal B may be adjusted by a second factor 540B to adjust for the lack of magnetic coupling by the coupler.

The sensor C 430 which is the basis for the integrated signal C 530C has a generally known relationship to the coupler and therefore an approximate adjustment factor 550 may be determined based upon the location of the conductor relative to the coupler. For example, the signal C may be adjusted by a third factor 540C to adjust for the lack of magnetic coupling by the coupler.

The integrated signal A 530A, the integrated signal B 530B, and the integrated signal C 530C may be used to determine the location of the conductor 550. By way of example, the differences in the magnitude of the integrated signals A, B, C may be used to determine the location of the conductor, such as by using a triangulation technique. The location of the conductor 550 may thus be used to determine, at least in part, the adjustment signals 540A, 540B, 540C.

The process may adjust 540A the integrated signal A 530A based upon the location of the conductor relative to the coupler to provide an adjusted signal 560A. The process may adjust 540B the integrated signal B 530B based upon the location of the conductor relative to the coupler to provide an adjusted signal 560B. The process may adjust 540C the integrated signal C 530C based upon the location of the conductor relative to the coupler to provide an adjusted signal 560C.

The first, second, and third factors may be different to adjust for the difference in the distance between the conductor and the relative sensor. The distance between the conductor and the relative sensor may be determined in any manner, such as determining the difference in the magnitudes sensed by the conductors. The first, second, and third factors may be different to adjust for the difference in the relative relationship of the conductor to the coupler.

The adjusted signals 560A, 560B, 560C, may be combined 570 to determine a corresponding value for the signal in the conductor 200. By way of example, the adjusted signals 560A, 560B, 560C may be averaged together, if desired. This increases the accuracy of the signal that is determined. An output signal 580 from the combine signals 570 may provide adjusted magnitude information of the current in the conductor 200.

Figure 20:
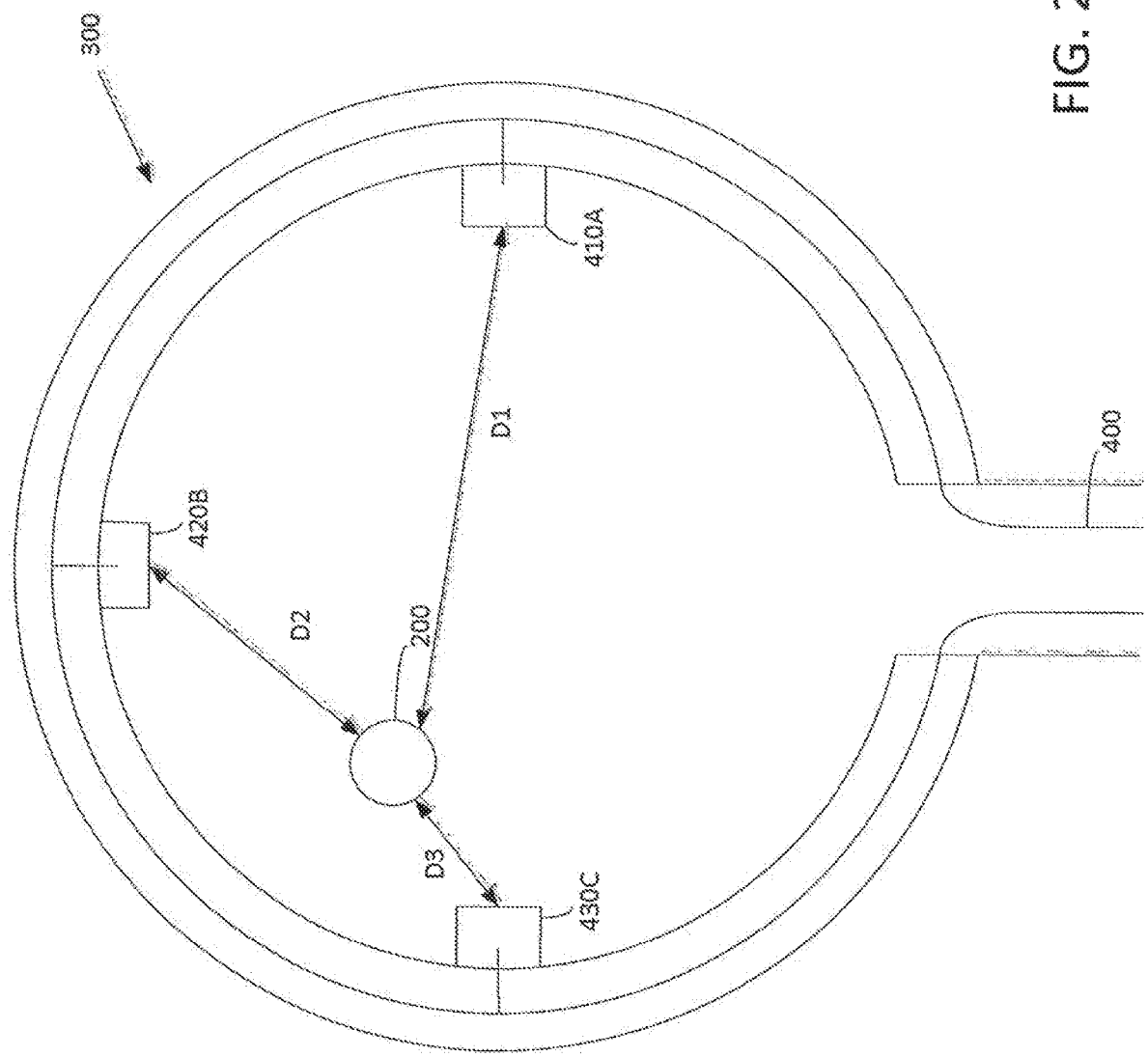
FIG. 20 illustrates a distance determination to a conductor.

Referring to FIG. 20, the location module 550 may determine the position of the conductor 200 as a position within the loop. For example, a distance measure D1 may be determined that estimates the distance of the conductor 200 from the sensor 410. For example, a distance measure D2 may be determined that estimates the distance of the conductor 200 from the sensor 420. For example, a distance measure D3 may be determined that estimates the distance of the conductor 200 from the sensor 430. The distances D1, D2, D3 may be used to determine the position of the conductor 200 within the coil 300 which may be used for an adjustment.

Figure 21:
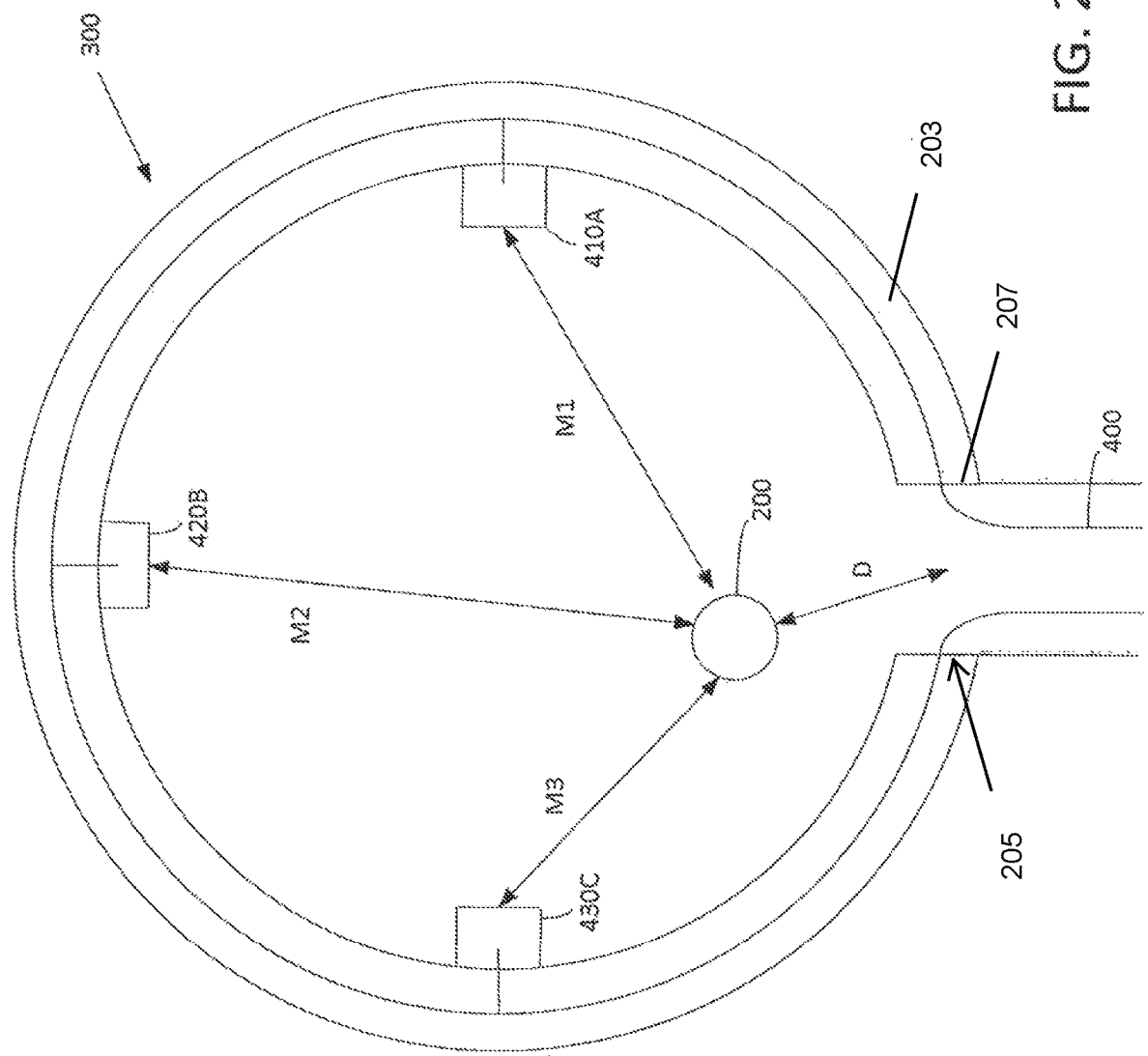
FIG. 21 illustrates an offset for a conductor for a connector.

Referring to FIG. 21, the location module 550 may determine an offset value indicative of an adjustment corresponding to the location of the conductor 200 within the loop to account for the proximity of the conductor 200 to the connector. For example, a magnitude measure M1 may be determined that estimates the magnitude of the conductor 200 from the sensor 410. For example, a magnitude measure M2 may be determined that estimates the magnitude of the conductor 200 from the sensor 420. For example, a distance measure M3 may be determined that estimates the magnitude of the conductor 200 from the sensor 430. The magnitudes M1, M2, M3 may be used to determine an offset value for the conductor 200 within the coil 300. By way of example, the offset value may be based upon an estimated distance D from the coupling. The substantially flexible core material 203 has a first end portion 205 and a second end portion 207.

Figure 22:
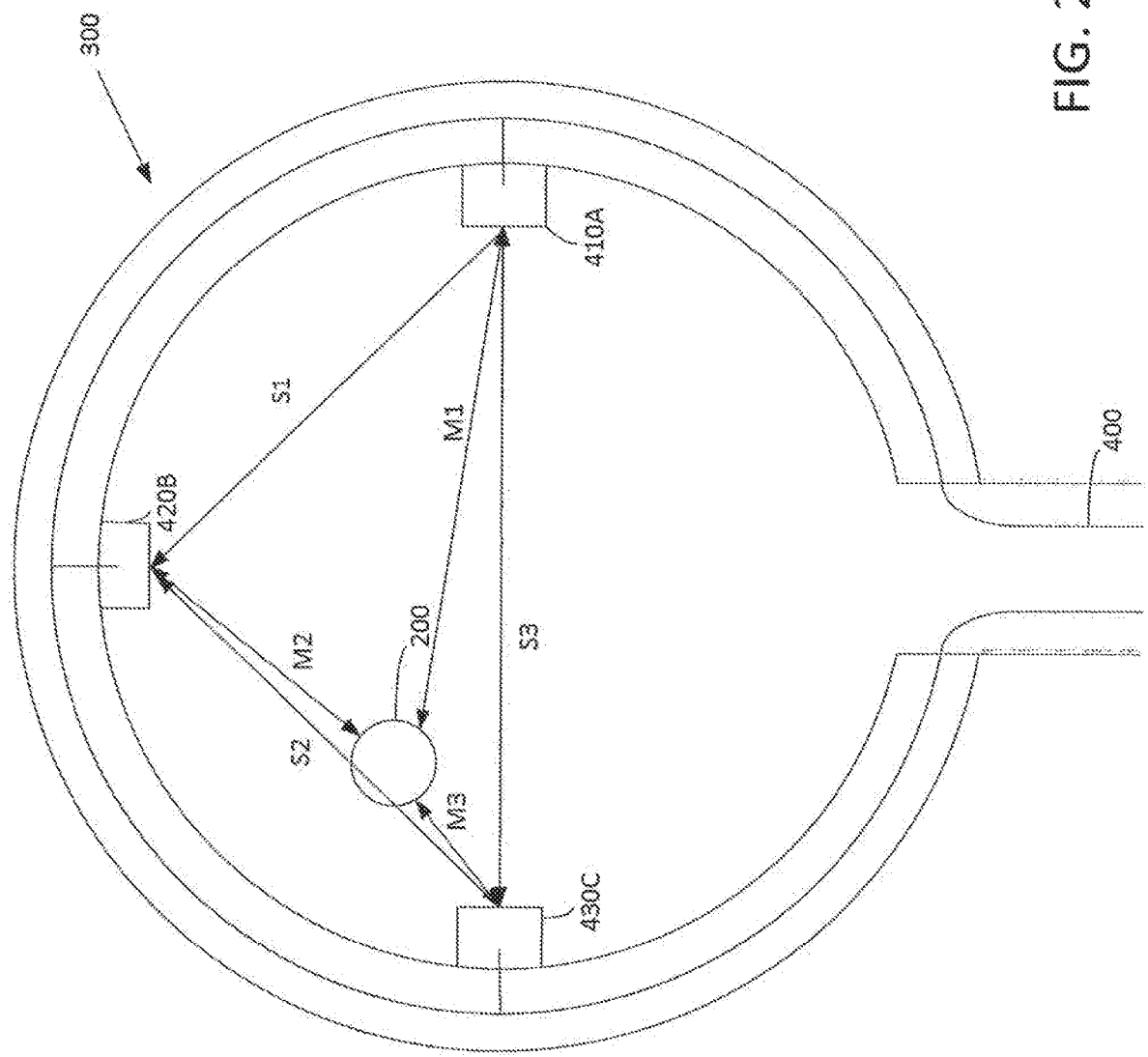
FIG. 22 illustrates an adjustment for a conductor to a connector.

Referring to FIG. 22, the location module 550 may determine whether the position of the conductor 200 within the loop is sufficiently close to the closure mechanism so that an adjustment is desirable. For example, a sufficiency measure S1 may be determined that estimates the difference in the sensed magnitude of the conductor 200 from the sensors 410A (sensing magnitude M1) and 420B (sensing magnitude M2). For example, a sufficiency measure S2 may be determined that estimates the difference in the sensed magnitude of the conductor 200 from the sensors 420B (sensing magnitude M2) and 430C (sensing magnitude M3). For example, a sufficiency measure S3 may be determined that estimates the difference in the sensed magnitude of the conductor 200 from the sensors 430C (sensing magnitude M3) and 410A (sensing magnitude M1). The sufficiency measures S1, S2, and/or S3 may be used to determine whether an offset value should be used for the determination of the signal within the coil, such as whether the conductor is sufficiently close to the closure. In the event that the conductor is not proximate the closure, then the adjustment may be omitted (or use a unity factor), if desired. The detectors can likewise be used to determine the location of the conductor with a deformed Rogowski coil. The detectors can likewise be used to determine the location of the conductor with a Rogowski coil that has more than one wrap around the conductor.

In some embodiments, it may not be desirable to have the conductor within the Rogowski coil in a position that results in sub-optimal sensing characteristics. Typically, it is undesirable for the conductor maintained within the Rogowski coil to be sufficiently proximate the connector, which tends to introduce substantial errors into the measurements of the conductor, Based upon the one or more sensors 410A, 420B, 430C, or other positioning identification mechanisms, the position of the conductor is identified.

Figure 23:
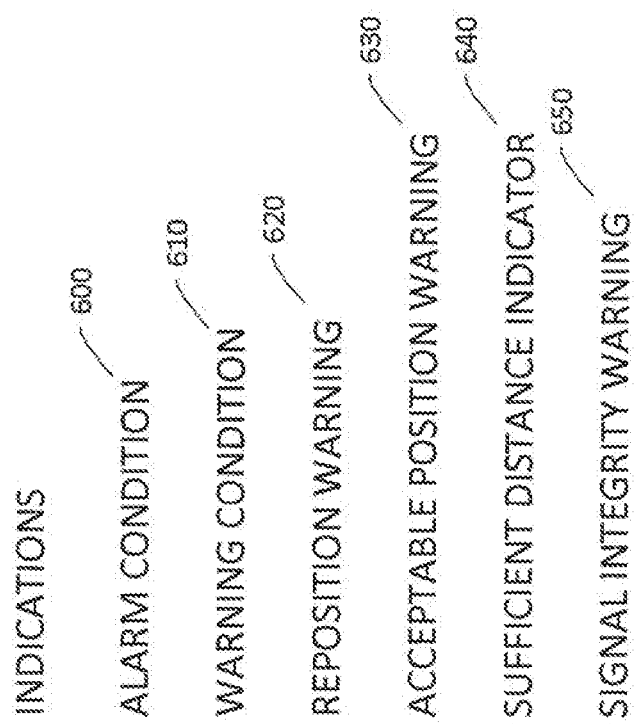
FIG. 23 illustrates indicators for a Rogowski coil.

Referring to FIG. 23, based upon the estimated location of the conductor within the Rogowski coil one or more indicators may be provided. The indicators provide information that may be used to further determine whether the Rogowski coil should be adjusted in its position.

One of the indicators may be an alarm condition 600 that may be indicated. The alarm condition indicates that the conductor is sufficiently close to the connector of the Rogowski coil. The alarm condition 600 may be indicated by a visual indicator, such as a red light that is visible to the user. The alarm condition 600 may be indicated by a digital command indicator, such as an alarm condition that may be provided through a network connection.

One of the indicators may be a warning condition 610 that may be indicated. The warning condition indicates that the conductor is further distant from the connector than the alarm condition but sufficiently close to the connector to be likely prone to significant error, especially if accurate measurements are desired. The warning condition 610 may be indicated by a visual indicator, such as a yellow light that is visible to the user. The warning condition 610 may be indicated by a digital command indicator, such as a warning condition that may be provided through a network connection.

One of the indicators may be a reposition warning 620 that may be indicated. The reposition warning 620 indicates that the conductor is sufficiently close to the connector such that the user should consider repositioning the conductor within the Rogowski coil. The reposition warning 620 may be indicated by a visual indicator, such as a flashing red light that is visible to the user. The reposition warning 620 may be indicated by a digital command indicator, such as a reposition warning that may be provided through a network connection.

One of the indicators may be an acceptable position indicator 630 that may be indicated. The acceptable position indicator indicates that the conductor is sufficiently distant from the connector that accurate measurements may be obtained. The acceptable position indicator 630 may be indicated by a visual indicator, such as a green light that is visible to the user. The acceptable position indicator 630 may be indicated by a digital command indicator, such as an acceptable position indicator that may be provided through a network connection.

One of the indicators may be a sufficient distance indicator 640 that may be indicated. The sufficient distance indicator indicates that the conductor is sufficiently distant from the connector that reasonably accurate measurements may be obtained. The sufficient distance indicator 640 may be indicated by a visual indicator, such as a green light that is visible to the user. The sufficient distance indicator 640 may be indicated by a digital command indicator, such as a sufficient distance indicator that may be provided through a network connection.

One of the indicators may be a signal integrity warning 650 may be indicated if the conductor is to close to the coupler. The signal integrity warning provides an indication that the measurements may not be sufficiently accurate because the conductor is sufficiently close to the coupler. The signal integrity warning 650 may be indicated by a visual indicator, such as a light that is visible to the user. The signal integrity warning 650 may be indicated by a digital command indicator, such as a signal integrity warning that may be provided through a network connection.

Figure 24:
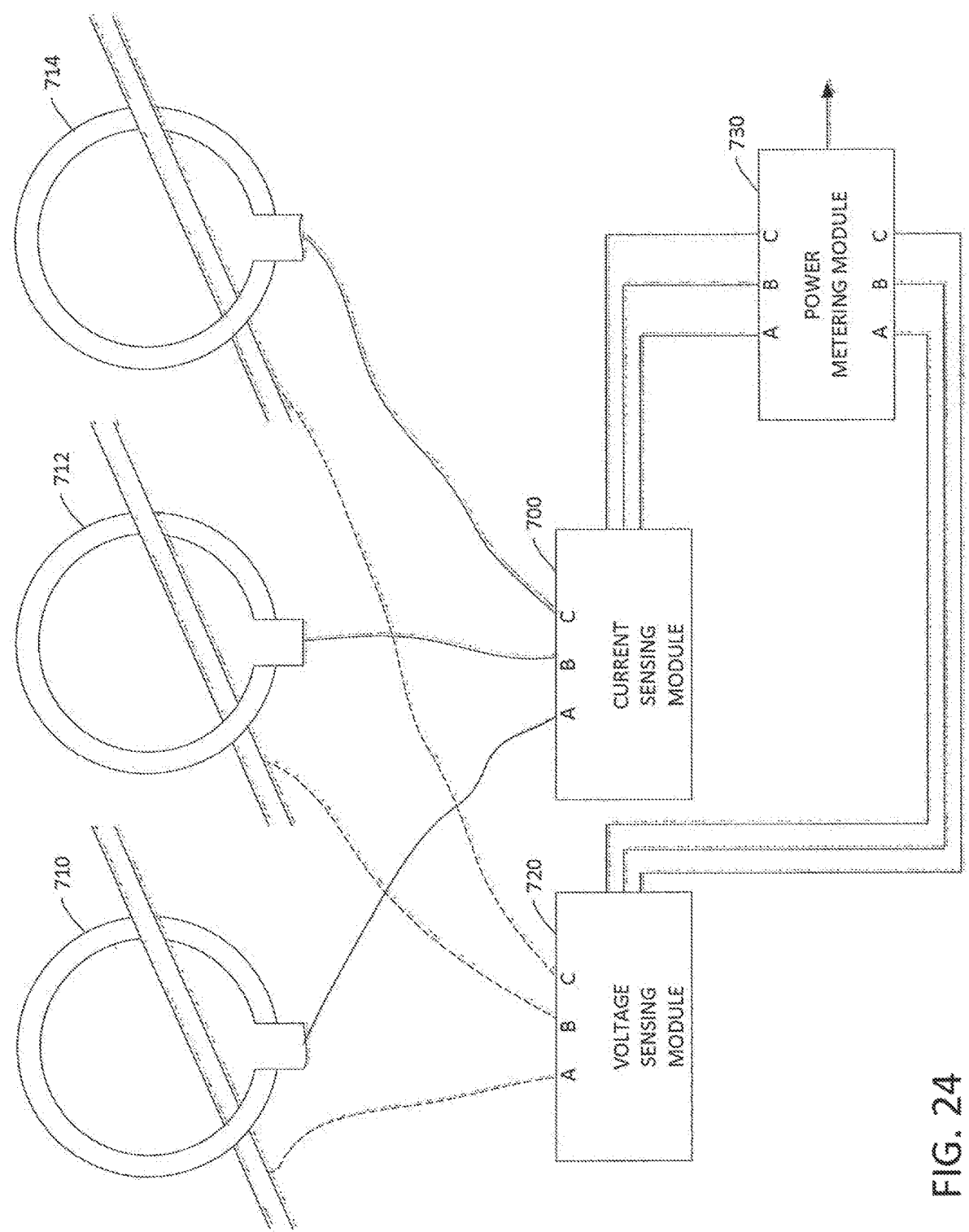
FIG. 24 illustrates Rogowski coils, a voltage sensing module, a current sensing module, and a power metering module.

Referring to FIG. 24, a current sensing module 700 may receive signals from a plurality of Rogowski coils, such as 3 different Rogowski coils 710, 712, 714. In this manner, the Rogowski coils may be used to sense single phase current, two phase current, and/or three phase current. In addition, if desired, a voltage sensing module 720 may be used to sense the voltage for each of the phases, which may be accomplished using a voltage tap, a non-contact voltage sensor, or otherwise. The corresponding current and voltage signals may be multiplied together by a power metering module 730, together with the phase angle if desired, to determine power related information. In many environments, the installer may tend to position the Rogowski coils sufficiently close to one another in such a manner that they tend to have measureable cross-talk between the coils, thus degrading the measurements therefrom.

Figure 25:
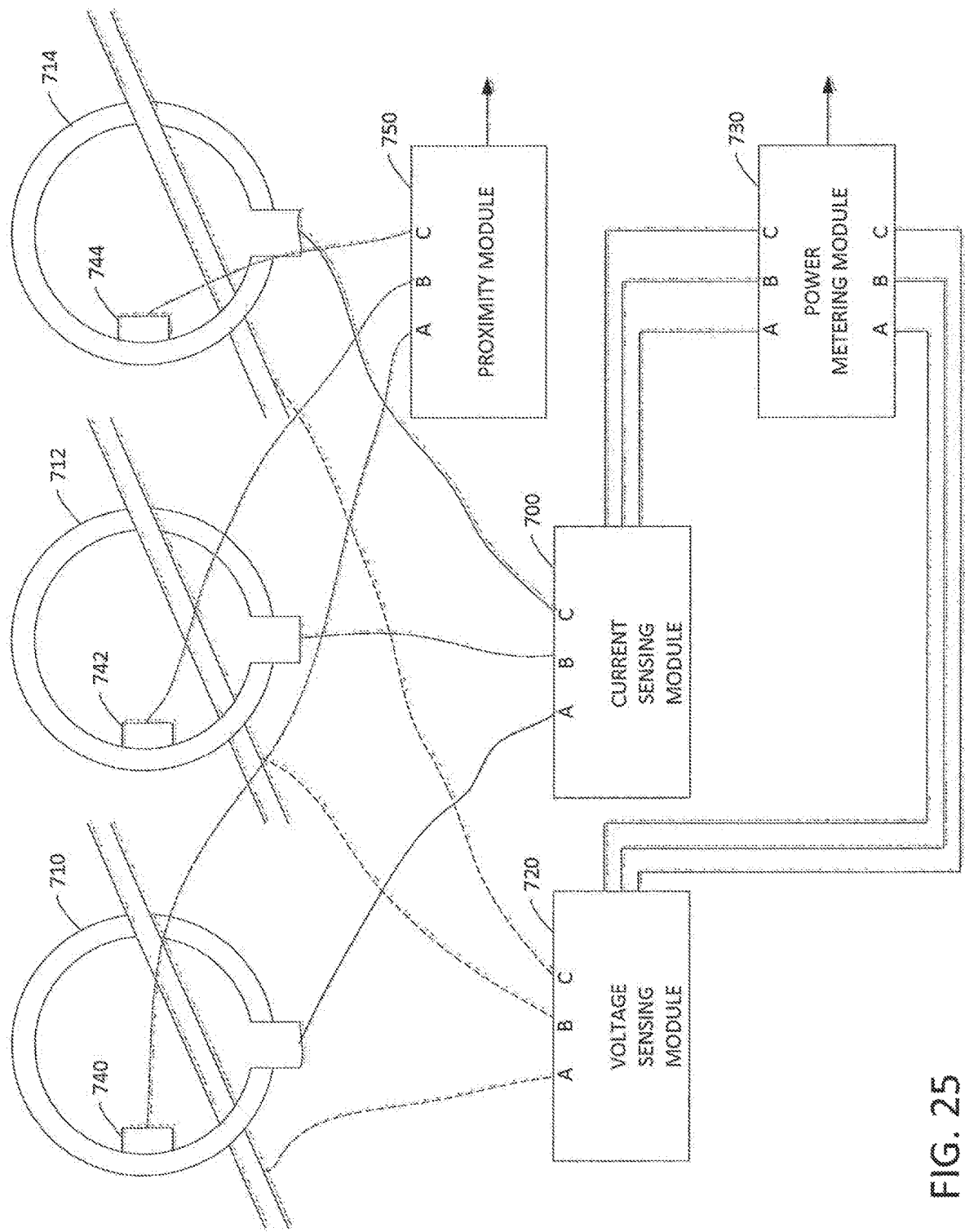
FIG. 25 illustrates Rogowski coils with proximity sensors.

Referring to FIG. 25, each of the Rogowski coils may include one or more proximity sensors 740, 742, 744, supported by the corresponding Rogowski coil. Each of the proximity sensors 740, 742, 744, may transmit a signal which is received by the other proximity sensors. Based upon the transmission and reception of signals among the proximity sensors, the relative spacing between the Rogowski coils may be determined by a proximity module 750. Other proximity based sensors may likewise be used, if desired. In the event that the Rogowski coils are sufficiently close together, then the current sensing module and/or the voltage sensing module and/or other associated module may provide an indication that the Rogowski coils should be repositioned. The indication may, for example, be in the form of a visual indicator or a digital command indicator provided through a network.

Figure 26:
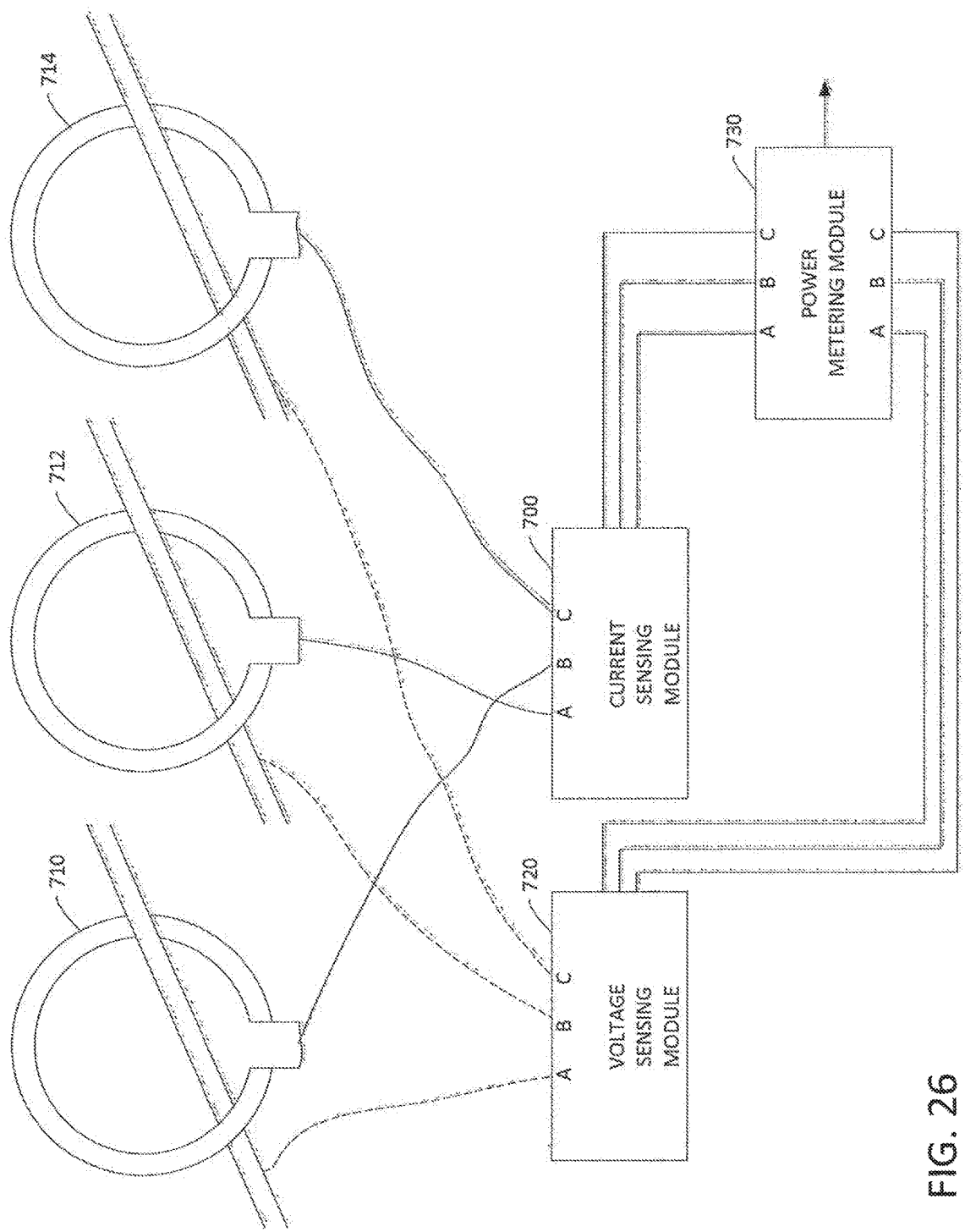
FIG. 26 illustrates Rogowski coils with voltage and current phases improperly matched.

Referring to FIG. 26, each of the Rogowski coils 710, 712, 714 may be interconnected with the current sensing module 700 and/or the voltage sensing module 720 using a flexible connector, such as one or more flexible wires. With the flexibility in the connection of the Rogowski coils to any particular conductor, often the phases are not properly aligned between the conductors and the current sensor and/or voltage sensor. For example, phase A of a three phase set of conductors may be interconnected to phase A of the current sensing module and phase B of the voltage sensing module; phase B of the three phase set of conductors may be interconnected to phase B of the current sensing module and phase A of the voltage sensing module; phase C of the three phase set of conductors may be interconnected to phase C of the current sensing module and phase C of the voltage sensing module. With at least one of the phases improperly interconnected, the resulting current measurement for at least one of the phases will be incorrect and the resulting power measurements from the power metering module 730 will likewise be incorrect.

Figure 27:
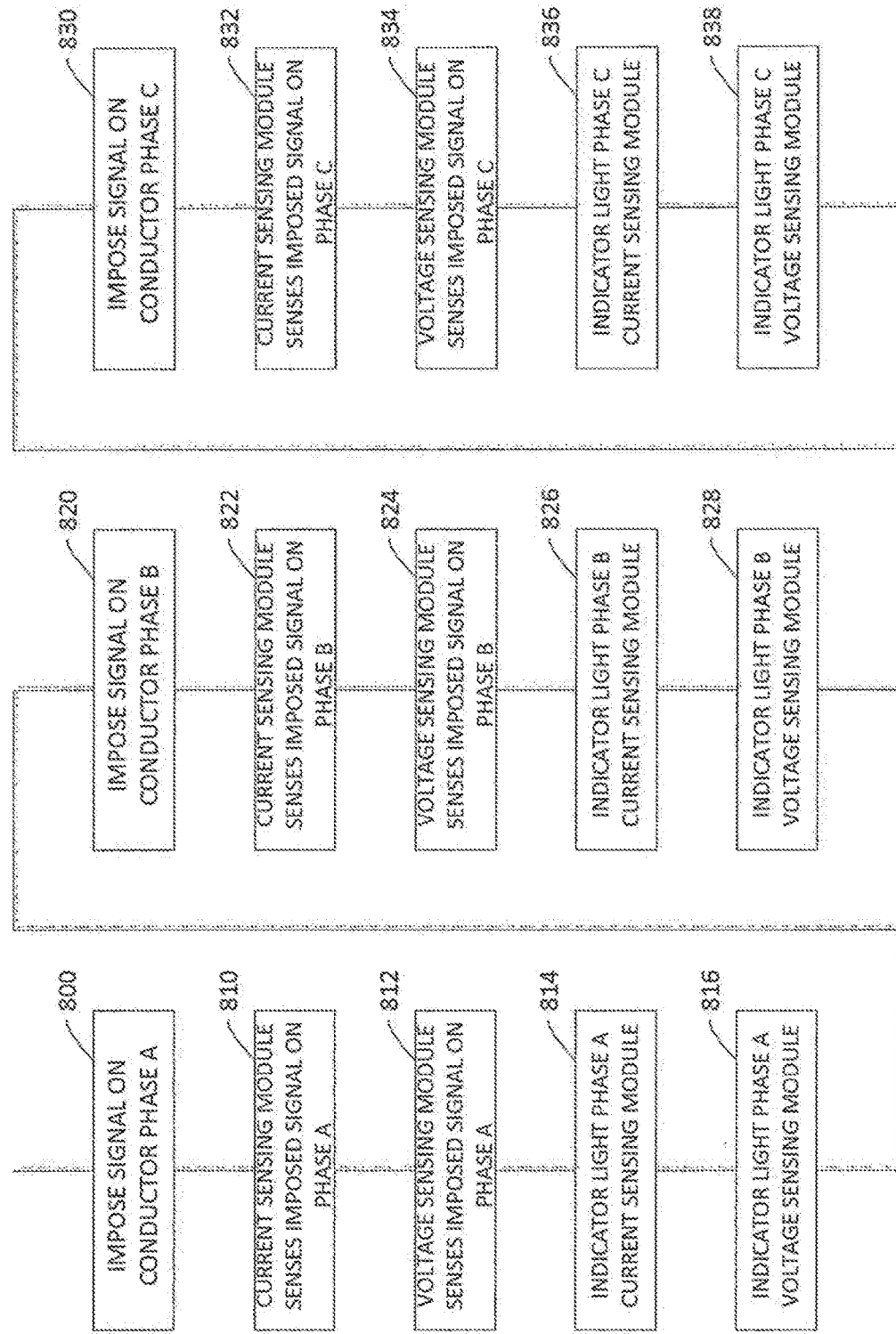
FIG. 27 illustrates Rogowski coils with voltage and current alignment mechanism.

Referring to FIG. 27, a visual based technique may be used to assist in the verification that the Rogowski coil together with its current and/or voltage signals are properly correlated with one another. A signal may be imposed on phase A of the conductor 800, such as by using the voltage connector or another connector, so that a corresponding signal is imposed in the phase A conductor. Preferably the imposed signal on the conductor 800 is in the nature of higher frequency component, such as an impulse like signal or a high frequency alternating signal, that is readily sensed by the current sensing module 810 and/or sensed by the voltage sensing module 812. Upon sensing the imposed signal on phase A, an indicator light 814 may be signaled on a phase A on the current sensing module and an indicator light 816 may be signaled on a Phase A on the voltage sensing module, so that a determination may be made that the voltage and current phases are suitably matched. Independent of the physical connections to the current and/or voltage sensing modules, the system may dynamically re-assign the connections so that they are logically matched to one another.

A signal may be imposed on phase B of the conductor 820, such as by using the voltage connector or another connector, so that a corresponding signal is imposed in the phase B conductor. Preferably the imposed signal on the conductor 800 is in the nature of higher frequency component, such as an impulse like signal or a high frequency alternating signal, that is readily sensed by the current sensing module 822 and/or sensed by the voltage sensing module 824. Upon sensing the imposed signal on phase B, an indicator light 826 may be signaled on a phase B on the current sensing module and an indicator light 828 may be signaled on a Phase B on the voltage sensing module, so that a determination may be made that the voltage and current phases are suitably matched.

A signal may be imposed on phase C of the conductor 830, such as by using the voltage connector or another connector, so that a corresponding signal is imposed in the phase C conductor. Preferably the imposed signal on the conductor 830 is in the nature of higher frequency component, such as an impulse like signal or a high frequency alternating signal, that is readily sensed by the current sensing module 832 and/or sensed by the voltage sensing module 834. Upon sensing the imposed signal on phase C, an indicator light 836 may be signaled on a phase C on the current sensing module and an indicator light 838 may be signaled on a Phase C on the voltage sensing module, so that a determination may be made that the voltage and current phases are suitably matched.

In this manner the system may be suitably configured to ensure current phases A, B, and C are in proper alignment. In this manner the system may be suitably configured to ensure voltage phases A, B, and C are in proper alignment. In this manner, the system may be suitably configured to ensure current and voltage phases A, current and voltage phases B, and current and voltage phases C are suitably matched together.

In another embodiment, the voltage sensing module may impose a signal on the voltage connection to phase A, which in turn imposes the signal in the conductor, which in turn is sensed by a first connection from the Rogowski coil to the current sensing module. After imposing such a signal, the voltage connection to Phase A is matched with the first connection for the Rogowski coil current sensing, so that the corresponding voltage and current signals may be matched. The voltage sensing module may impose a signal on the voltage connection to phase B, which in turn imposes the signal in the conductor, which in turn is sensed by a second connection from the Rogowski coil to the current sensing module. After imposing such a signal, the voltage connection to Phase B is matched with the second connection for the Rogowski coil current sensing, so that the corresponding voltage and current signals may be matched. The voltage sensing module may impose a signal on the voltage connection to phase C, which in turn imposes the signal in the conductor, which in turn is sensed by a third connection from the Rogowski coil to the current sensing module. After imposing such a signal, the voltage connection to Phase C is matched with the third connection for the Rogowski coil current sensing, so that the corresponding voltage and current signals may be matched. In this manner, it may be observed, that each of the voltage phases may be matched with the corresponding Rogowski coil for that phase, so that single phase, two phase, and three phase power measurements may be properly determined.

In another embodiment a conductive based core, such as a ferrite core, may be used as the current transformer. In addition, the current transformer may be a solid core or a split core current transformer.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A coil for sensing a changing current comprising:
    (a) an elongate substantially flexible core material, said elongate substantially flexible core material having a first end portion and a second end portion, said elongate substantially flexible core material having a middle portion between said first end portion and said second end portion, said second end portion at an opposite end of said elongate substantially flexible core material than said first end portion;
    (b) an elongate conductive member supported by said middle portion of said substantially flexible core material and encircling said middle portion of said substantially flexible core material;
    (c) said first end portion and said second end portion maintained in a position proximate one another;
    (d) at least two sensors supported by said substantially flexible core material;
    (e) a sensing module that receives a signal from said elongate conductive member and estimates a signal within a conductor at least partially encircled within said elongate substantially flexible core material;
    (f) a location module that receives respective location signals from said at least two sensors, wherein said location signals are based upon electrical characteristics of said signal within said conductor, and estimates location information of said conductor at least partially encircled within said elongate substantially flexible core material based upon said respective location signals;
    (g) an indicator selectively provided based upon said location of said conductor.

2. The coil of claim 1 wherein said elongate substantially flexible core material is substantially round in cross section.

3. The coil of claim 2 wherein said elongate conductive member is a wire wrapped around said substantially flexible core material.

4. The coil of claim 1 wherein said sensing module includes an amplification circuit for said signal from said elongate conductive material.

5. The coil of claim 4 wherein said sensing module includes an integration circuit for said signal from said elongate conductive material.

6. The coil of claim 1 wherein said location information is relative to said first and second end portions.

7. The coil of claim 1 wherein said indicator is a visual indicator.

8. The coil of claim 1 wherein said indicator is a digital indicator.

9. The coil of claim 1 wherein said indicator is an alarm condition.

10. The coil of claim 1 wherein said indicator is a warning condition.

11. The coil of claim 1 wherein said warning condition is based upon a distance of said conductor being further from an alarm condition.

12. The coil of claim 1 wherein said indicator is a reposition warning.

13. The coil of claim 1 wherein said indicator is an acceptable position.

14. The coil of claim 1 wherein said indicator is transmitted using a wireless transmitter.

15. The coil of claim 1 wherein said indicator is a sufficient distance.

16. The coil of claim 1 wherein said indicator is a signal integrity warning.

17. A coil for sensing a changing current comprising:
(a) a first elongate substantially flexible core material, said first elongate substantially flexible core material having a first end portion and a second end portion, said first elongate substantially flexible core material having a middle portion between said first end portion and said second end portion, said second end portion at an opposite end of said first elongate substantially flexible core material than said first end portion;
(b) a second elongate substantially flexible core material, said second elongate substantially flexible core material having a first end portion and a second end portion, said second elongate substantially flexible core material having a middle portion between said first end portion and said second end portion, said second end portion at an opposite end of said second elongate substantially flexible core material than said first end portion;
(c) a third elongate substantially flexible core material, said third elongate substantially flexible core material having a first end portion and a second end portion, said third elongate substantially flexible core material having a middle portion between said first end portion and said second end portion, said second end portion at an opposite end of said third elongate substantially flexible core material than said first end portion;
(d) a first elongate conductive member supported by said middle portion of said first substantially flexible core material and encircling said middle portion of said first substantially flexible core material;
(e) a second elongate conductive member supported by said middle portion of said second substantially flexible core material and encircling said middle portion of said second substantially flexible core material;
(f) a third elongate conductive member supported by said middle portion of said third substantially flexible core material and encircling said middle portion of said third substantially flexible core material;
(g) said first end portion and said second end portion of said first elongate conductive member maintained in a position proximate one another;
(h) said first end portion and said second end portion of said second elongate conductive member maintained in a position proximate one another;
(i) said first end portion and said second end portion of said third elongate conductive member maintained in a position proximate one another;
(j) a current sensing module that receives a respective signal from said first and second and third elongate conductive members and estimates a respective signal within a respective first and second and third conductors at least partially encircled within respective said first and second and third elongate substantially flexible core materials;
(k) a first and a second and a third current indicators based upon a respective signal from said current sensing module indicating the existence of (1) a first imposed higher frequency signal superimposed on said signal having a lower frequency on said first conductor is sensed for a corresponding first phase, (2) a second imposed higher frequency signal superimposed on said signal having a lower frequency on said second conductor is sensed for a corresponding second phase, and (3) a third imposed higher frequency signal superimposed on said signal having a lower frequency on said third conductor is sensed for a corresponding third phase, where said first phase, said second phase, and said third phase are three phases of a three phase signal.

18. The coil of claim 17 further comprising a first voltage indicator indicating the existence of said first imposed signal superimposed on said signal on said conductor for said corresponding first phase.

* * * * *